(12) United States Patent
Chakraborty et al.

(10) Patent No.: US 7,954,022 B2
(45) Date of Patent: May 31, 2011

(54) APPARATUS AND METHOD FOR CONTROLLING DYNAMIC MODIFICATION OF A SCAN PATH

(75) Inventors: Tapan Chakraborty, Princeton Junction, NJ (US); Chen-Huan Chiang, Princeton Junction, NJ (US); Suresh Goyal, Warren, NJ (US); Michele Portolan, Dublin (IE); Bradford G. Van Treuren, Lambertville, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 343 days.

(21) Appl. No.: 12/022,523

(22) Filed: Jan. 30, 2008

(65) Prior Publication Data

US 2009/0193306 A1    Jul. 30, 2009

(51) Int. Cl.
*G01R 31/28* (2006.01)
(52) U.S. Cl. .................... 714/726; 714/727; 714/729
(58) Field of Classification Search .................. None
See application file for complete search history.

(56) References Cited

U.S. PATENT DOCUMENTS

| | | | |
|---|---|---|---|
| 4,872,169 A | 10/1989 | Whetsel | |
| 6,088,822 A | 7/2000 | Warren | |
| 6,430,718 B1 | 8/2002 | Nayak | |
| 6,456,961 B1 | 9/2002 | Patil et al. | |
| 6,587,981 B1 | 7/2003 | Muradali et al. | |
| 6,631,504 B2 | 10/2003 | Dervisoglu et al. | |
| 6,665,828 B1 | 12/2003 | Arimilli et al. | |
| 6,708,144 B1 | 3/2004 | Merryman et al. | |
| 7,006,960 B2 | 2/2006 | Schaumont et al. | |
| 7,181,705 B2 | 2/2007 | Dervisoglu et al. | |
| 7,188,330 B2 | 3/2007 | Goyal | |
| 7,296,200 B2 * | 11/2007 | Park et al. | 714/724 |
| 2003/0046015 A1 | 3/2003 | Gotoh et al. | |
| 2003/0131296 A1 | 7/2003 | Park et al. | |
| 2003/0131327 A1 | 7/2003 | Dervisoglu et al. | |
| 2003/0145286 A1 | 7/2003 | Pajak et al. | |

(Continued)

FOREIGN PATENT DOCUMENTS

JP        62 093672 A    4/1987

(Continued)

OTHER PUBLICATIONS

"IEEE Standard Test Access Port and Boundary-Scan Architecture," IEEE Std. 1149.1-2001.

(Continued)

*Primary Examiner* — Robert Beausoliel
*Assistant Examiner* — Guerrier Merant
(74) *Attorney, Agent, or Firm* — Wall & Tong, LLP

(57) ABSTRACT

The invention includes an apparatuses and associated methods for controlling dynamic modification of a testing scan path using a control scan path. In one embodiment, an apparatus includes a testing scan path and a control scan path. The testing scan path includes testing components and at least one hierarchy-enabling component. In one embodiment, the control scan path includes at least one control component coupled to the at least one hierarchy-enabling component for controlling dynamic modification of the testing scan path. In one embodiment, the control scan path includes the at least one hierarchy-enabling component, wherein the at least one hierarchy-enabling component is adapted for dynamically modifying the testing scan path using the control scan path. The dynamic modification of the testing scan path may include modifying a hierarchy of the testing scan path, such as selecting or deselecting one or more hierarchical levels of the testing scan path.

20 Claims, 16 Drawing Sheets

U.S. PATENT DOCUMENTS

| | | |
|---|---|---|
| 2004/0002832 A1 | 1/2004 | Chan |
| 2005/0097416 A1 | 5/2005 | Plunkett |
| 2005/0262465 A1 | 11/2005 | Goyal |
| 2005/1026246 | 11/2005 | Goyal at al. |
| 2006/0179373 A1 | 8/2006 | Ishikawa |
| 2006/0282729 A1 | 12/2006 | Dastidar et al. |
| 2007/0094629 A1 | 4/2007 | Alter et al. |
| 2008/0141087 A1 | 6/2008 | Whetsel |
| 2009/0144592 A1 | 6/2009 | Chakraborty et al. |
| 2009/0144593 A1 | 6/2009 | Chakraborty et al. |
| 2009/0144594 A1 | 6/2009 | Chakraborty et al. |
| 2009/0193304 A1 | 7/2009 | Chakraborty et al. |

FOREIGN PATENT DOCUMENTS

| | | |
|---|---|---|
| WO | WO 2007/049171 A | 5/2007 |
| WO | WO 2005/078465 A | 8/2008 |

OTHER PUBLICATIONS

IEEE 1687 IJTAG HW Proposal, 1687 Proposed Hardware Architecture Summary Update, v7.0, Jun. 25, 2007.

PCT Search Report and The Written Opinion of the International Searching Authority, or the Declaration, dated May 11, 2009, in PCT/US2009/000453, Alcatel-Lucent USA Inc., Applicant, 15 pages.

International Search Report and Written Opinion dated Mar. 19, 2009 in International Application No. PCT/US2008/013110, Alcatel-Lucent USA Inc., Applicant, 15 pages.

International Search Report and Written Opinion dated Mar. 19, 2009 in International Application No. PCT/US2008/013054, Alcatel-Lucent USA Inc., Applicant, 15 pages.

International Search Report and Written Opinion, dated Feb. 19, 2009, in PCT/US2008/013109, Alcatel-Lucent USA Inc., Applicant, 15 pages.

International Search Report and Written Opinion, dated Nov. 5, 2009, in PCT/US2009/000346, Alcatel-Lucent USA Inc., Applicant, 15 pages.

Melocco K et al: "A comprehensive approach to assessing and analyzing 1149.1 test logic" Proceedings International Test Conference 2003. (ITC). Charlotte, NC, Sep. 30-Oct. 2, 2003; [International Test Conference], New York, NY : IEEE, US, vol. 2, Sep. 30, 2003, pp. 40-49, XP010685379 ISBN: 978-0-7803-8106-3.

Brian Foutz et al: "Automation of IEEE 1149.6 Boundary Scan Synthesis in an ASIC methodology" Test Symposium, 2006. ATS '06. 15th Asian, IEEE, PI, Nov. 1, 2006, pp. 381-388, XP031030539 ISBN: 978-0-695-2628-7.

"Hierarchical Scan Description Language Syntax Specification," ASSET InterTech, Inc. 1997.

IEEE Standard VHDL Language Reference Manuel, IEEE Std. 1076, 2000 Edition.

Rearick, J., et al., "IJTAG (Internal JTAG): A Step Toward a DFT Standard," 2005, IEEE pp. 1-10.

Carlsson, G., et al., "Protocol Requirements in an SJTAG/IJTAG Environment," 2007, IEEE, pp. 1-9.

Crouch, A., et al., "IJTAG: The Path to Organized Instrument Connectivity," 2007, IEEE, pp. 1-10.

Eklow, B., et al., "Microsoft Power Point—ETS06—IJTAG-Embedded-Tutorial-v2," May 23, 2006, IEEE P1687 (IJTAG), pp. 1-42.

* cited by examiner

US 7,954,022 B2

APPARATUS AND METHOD FOR CONTROLLING DYNAMIC MODIFICATION OF A SCAN PATH

FIELD OF THE INVENTION

The invention relates to the field of electronics and, more specifically, to testing of printed circuit boards, system-on-chips, and systems.

BACKGROUND OF THE INVENTION

Joint Test Action Group (JTAG) refers to the IEEE 1149 standard for test access ports for testing printed circuit boards using boundary scan. JTAG is used by Automated Test Generation (ATG) tools to test printed circuit boards. Instrument JTAG (IJTAG) is now being standardized (referred to as the IEEE P1687 standard) to overcome existing JTAG limitations associated with the move from board-level JTAG to chip-level JTAG. IJTAG proposes inclusion of dynamic hierarchical paths inside data registers using dynamic hierarchical cells, such as the cell referred to as the Select Instrument Bit (SIB) cell. The use of dynamic hierarchical paths enables portions of the scan path to be turned on and off as needed. Thus, dynamic hierarchical paths that are enabled by use of cells like the SIB are a valuable testing resource because, as the number of elements in the scan path is important in determining testing time, careful use of hierarchy may be used to reduce testing time.

As described in the proposed IEEE P1687 standard, the scan chain is a linear scan chain and each SIB cell that is inserted into the scan chain is inserted in order to introduce hierarchy into the scan chain. Thus, since the scan chain is linear, and each SIB cell included in the linear scan chain must be accessed linearly via the scan chain in order to activate hierarchy in the scan chain, the length of the scan chain directly determines the amount of access time needed to modify and exercise the active hierarchy. While this limitation may seem insignificant in examples in which the scan chain only includes a few cells, this may be a significant limitation in real-life systems where the scan chain may include hundreds or even thousands of cells. While the impact of this problem may be reduced by use of accurate scheduling of testing procedures, this problem simply cannot be completely avoided by use of scheduling of testing procedures.

SUMMARY OF THE INVENTION

Various deficiencies in the prior art are addressed through apparatuses and associated methods for controlling a testing scan path of a system-on-chip using a separate control scan path of the system-on-chip.

In one embodiment, an apparatus includes a testing scan path having a plurality of testing components including at least one hierarchy-enabling testing component, and a control scan path including at least one control component coupled to the at least one hierarchy-enabling testing component of the testing scan path, wherein the at least one control component is adapted to control the at least one hierarchy-enabling testing component in a manner for dynamically modifying the testing scan path.

In one embodiment, an apparatus includes a testing scan path having a plurality of non-hierarchy-enabling testing components and at least one hierarchy-enabling component, and a control scan path including the at least one hierarchy-enabling component, wherein the at least one hierarchy-enabling component is adapted for dynamically modifying the testing scan path using the control scan path.

In one embodiment, a method includes applying a testing bitstream to a testing scan path of the system-on-chip, wherein the testing scan path supports hierarchy and applying a control bitstream to a control scan path of the system-on-chip, wherein the control bitstream is adapted for dynamically modifying the hierarchy of the testing scan path.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF THE INVENTION

Apparatuses and methods are provided that enable control of a testing scan path of a system-on-chip using a separate control scan path of the system-on-chip, thereby reducing access time (and, thus, testing time) for hierarchical scan paths. The control scan path enables control of the testing scan path in a manner for dynamically modifying the testing scan path (e.g., modifying the hierarchy of the testing scan path by enabling the dynamic activation/deactivation of one or more hierarchical levels of the testing scan path, as desired/needed). Although primarily depicted and described herein with respect to a linear control scan path, the control scan path may include multiple hierarchical levels for controlling the testing scan path.

Figure 1:
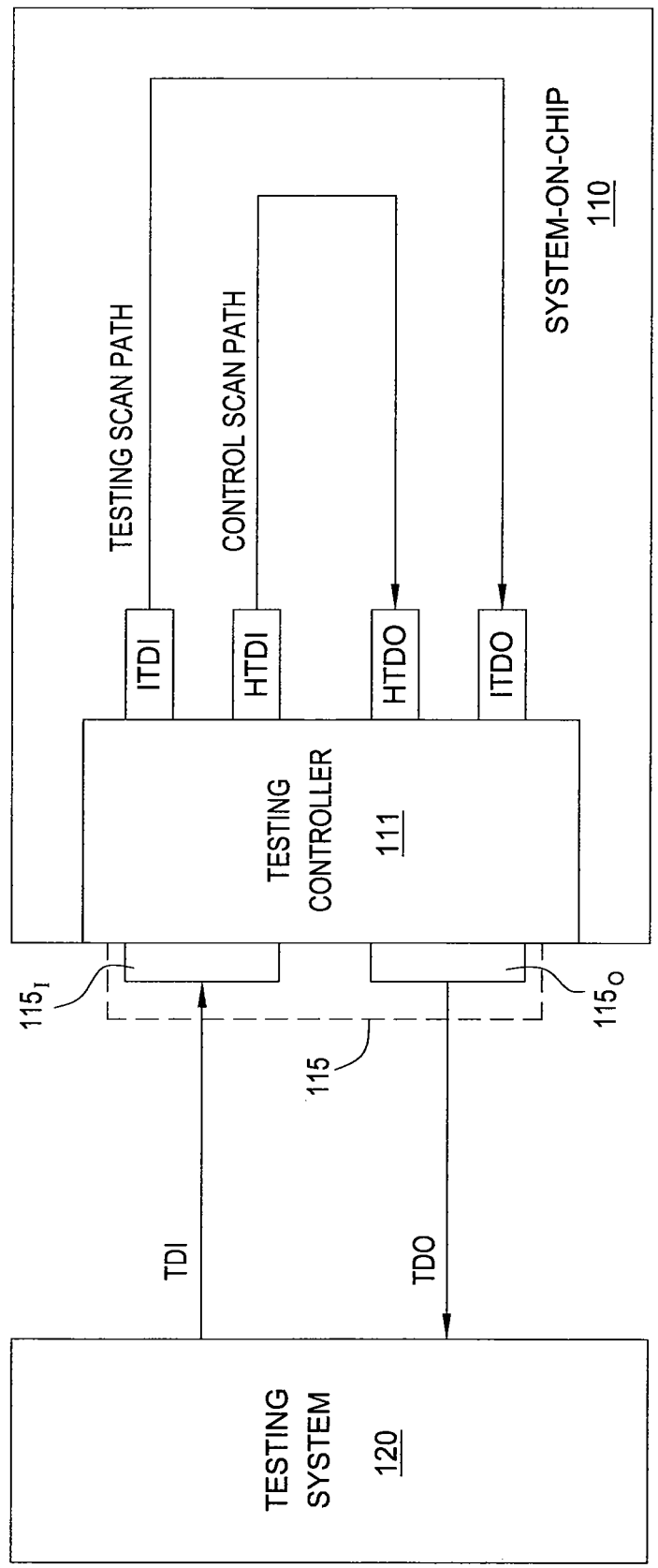
FIG. 1 depicts a high-level block diagram of a testing environment.

FIG. 1 depicts a high-level block diagram of a testing environment. Specifically, testing environment 100 includes a system-on-chip (S-o-C) 110 and a testing system (TS) 120. The TS 120 tests S-o-C 110 (e.g., testing individual components of S-o-C 110 (including functions of components), interconnections between components on S-o-C 110, system level functions of S-o-C 110, and the like, as well as various combinations thereof). As depicted in FIG. 1, TS 120 interfaces with the S-o-C 110 using a test access interface 115 including an input port $115_I$ (denoted as TDI) and an output port $115_O$ (denoted as TDO).

In one embodiment, in an environment according to the proposed IEEE P1687 standard, test access interface 115 may be implemented as a Test Access Port (TAP) as defined by the IEEE 1149.1 standard. In one such embodiment, although primarily depicted and described herein using the TDI/TDO ports, interface 115 may include other control ports, such as TCK ports, TMS ports, TRST ports, and the like, as well as other new control interfaces which may be required (all of which have been omitted for purposes of clarity). Although primarily depicted and described with respect to an interface implemented using the TAP defined by the IEEE 1149.1 standard, the interface 115 may be implemented in various other ways.

The S-o-C 110 supports a testing scan path and a control scan path. The testing scan path supports propagation of testing bitstreams. The control scan path supports propagation of control bitstreams. The testing scan path is a hierarchical scan path including a first hierarchical level and a second hierarchical level. The control scan path may or may not be a hierarchical scan path. The TS 120 accesses the testing scan path via the input port $115_I$ and the output port $115_O$ (i.e., via TDI/TDO). The TS 120 accesses the control scan path via the input port $115_I$ and the output port $115_O$ (i.e., via TDI/TDO). The S-o-C 110 includes a testing controller (TC) 111.

The TC 111 receives input bitstreams from TC 120 via input port $115_I$. The TC 111 controls application of input bitstreams to the testing scan path of S-o-C 110 (via an internal testing input interface ITDI) and the control scan path of S-o-C 110 (via an internal control input interface HTDI). The TC 111 transmits output bitstreams to TC 120 via output port $115_O$. The TC 111 controls selection of output bitstreams from the testing scan path of S-o-C 110 (via an internal testing output interface ITDO) and from the control scan path of S-o-C 110 (via an internal control output interface HTDO) for propagation to TS 120. The use of separate testing and control scan paths may be better understood with respect to FIG. 6-FIG. 10.

The TS 120 performs testing on S-o-C 110 using test procedures. The TS 120 may perform one or more tests using one or more test procedures. A test procedure may be used to test a portion of a component (e.g., a function of a component, a set of functions of a component, dependencies, and the like), a component, a group of components (e.g., interconnections between components, inter-component dependencies, and the like), one or more system level functions, and the like, as well as various combinations thereof. A test procedure(s) may be used to perform any other type of testing which may be performed on a system-on-chip.

The TS 120 generates a test procedure to test S-o-C 110. The test procedure specifies information required to test S-o-C 110. A test procedure for S-o-C 110 may specify a description of S-o-C 110 (including descriptions of each of the individual components of S-o-C 110, as well as a system level description of S-o-C 110). A test procedure may specify an input testing vector (to be applied to the scan path) and an expected output testing vector (expected to be received from the testing scan path). A test procedure may also specify a control signal or signals (to be applied to the system-on-chip). A test procedure may include any other information associated with a test (e.g., an estimated time required for the test, output data handling for the test, the like, as well as various combinations thereof).

The TS 120 tests S-o-C 110 by executing one or more test procedures on S-o-C 110. The TS 120 generates input testing bitstreams and expected testing results (e.g., expected output bit values or bitstreams) for each test to be performed. The TS also generates control signals. The TS 120 applies the input testing bitstreams (i.e., input test vectors) to TDI input port $115_I$. The TS 120 receives corresponding output testing bitstreams (referred to as output test vectors) from TDO output port $115_O$. The TS 120 compares the output testing bitstreams to the expected testing results in order to determine the results of the test.

The TS 120 may handle testing results from executed test procedures in any manner. In various embodiments, for example, TS 120 may present the testing results via a display interface, store the testing results in memory, propagate the testing results to one or more other systems, and the like, as well as assorted combinations thereof. The TS 120 may handle the testing results from executed test procedures in any other manner. The TS 120 may also handle some or all of the inputs to the testing in a similar manner (e.g., presenting, storing, propagating, and the like, as well as various combinations thereof).

The TS 120 may execute one or more test procedures to test S-o-C 110. The TS 120 may organize execution of multiple test procedures in a manner that tends to minimize a total test time required for performing a test (since different scheduling decisions will result in different testing completion times for the same set of test procedures). The TS 120 may specify a testing schedule (i.e., a schedule specifying an order according to which the different test procedures must be executed). The TS 120 may perform various other functions associated with testing of a system-on-chip.

Figure 2:
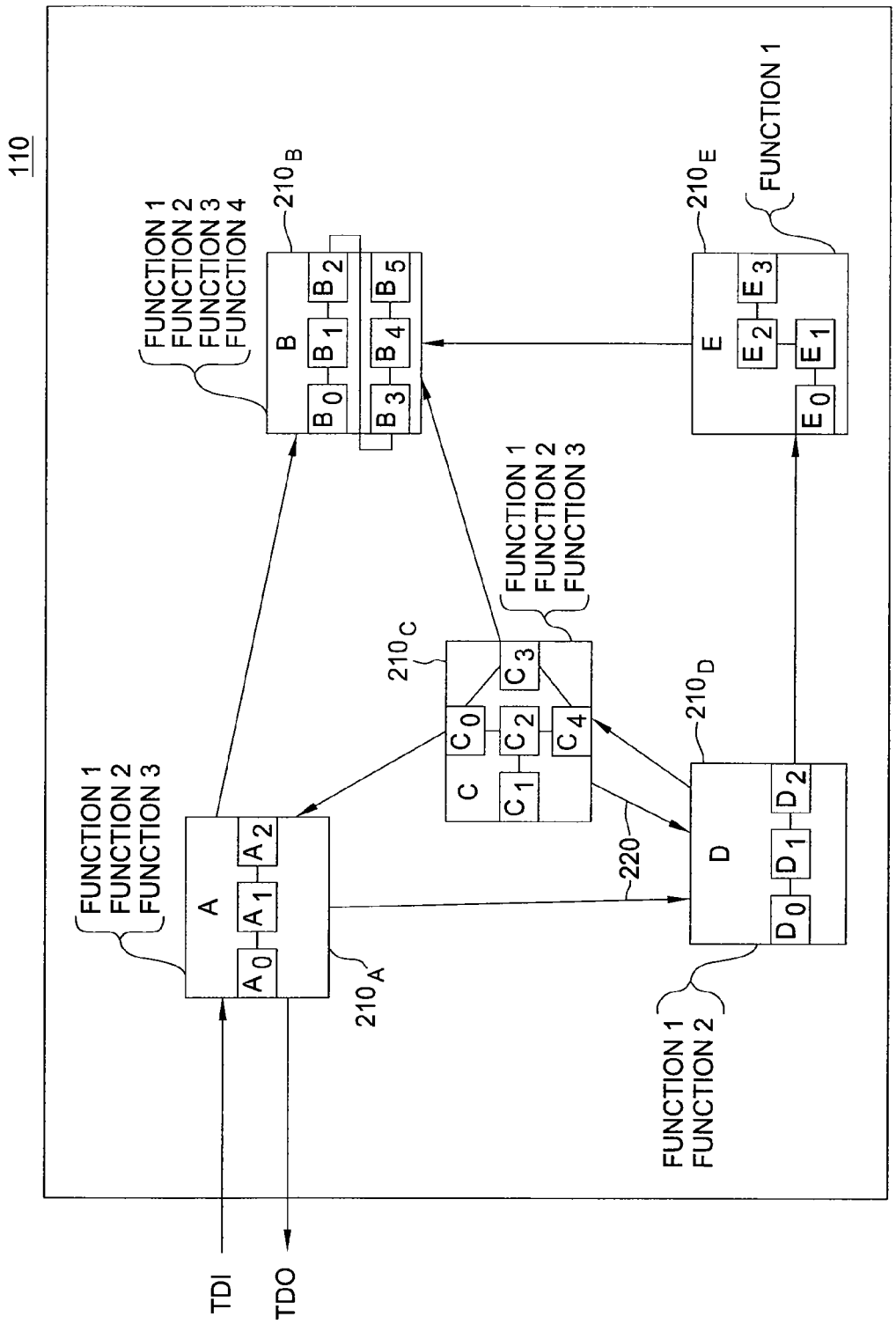
FIG. 2 depicts a high-level block diagram of an exemplary system-on-chip adapted for used in the testing environment of FIG. 1.

FIG. 2 depicts a high-level block diagram of an exemplary system-on-chip adapted for used in the testing environment of FIG. 1. As depicted in FIG. 2, S-o-C 110 includes a plurality of components $210_A$-$210_E$ (collectively, components 210) which are interconnected by a plurality of component interconnections 220 (collectively, component interconnections 220). It will be understood that S-o-C 110 depicted and described with respect to FIG. 2 merely constitutes an example of a system-on-chip (i.e., S-o-C 110 may include various other components that may be configured in various other ways).

As depicted in FIG. 2, each component 210 includes a plurality of internal registers. Specifically, component $210_A$ includes three registers ($A_0$, $A_1$, $A_2$), component $210_B$ includes six registers ($B_0$, $B_1$, $B_2$, $B_3$, $B_4$, $B_5$), component $210_C$ includes five registers ($C_0$, $C_1$, $C_2$, $C_3$, $C_4$), component $210_D$ includes three registers ($D_0$, $D_1$, $D_2$), and component $210_E$ includes four registers ($E_0$, $E_1$, $E_2$, $E_3$). The registers of each component 210 form an internal scan path for that component 210.

As depicted in FIG. 2, each component 210 supports at least one function. Specifically, component $210_A$ supports three functions, component $210_B$ supports four functions, component $210_C$ supports three functions, component $210_D$ supports two functions, and component $210_E$ supports one function. The functions supported by each of the components 210 make use of the registers (i.e., the internal scan paths) of each of the components 210, respectively.

As depicted in FIG. 2, components 210 of S-o-C 110 are connected via the component interconnections 220 of S-o-C 110. The components 210 (i.e., internal scan paths of the components 210) and component interconnections 220 between components 210 form a testing scan path from the input test port (TDI) of S-o-C 110 to the output test port (TDO) of S-o-C 110. The S-o-C 110 supports a control scan path in addition to the testing scan path. Since implementation of separate testing and control scan paths may be provided in many ways, the details of the control scan path are omitted from FIG. 2 for purposes of clarity (and may be better understood with respect to FIG. 6-FIG. 9).

The components 210 include any components which may be included in a system-on-chip system. In one embodiment, in a system implemented according to the proposed IEEE P1687 standard, components 210 may include intellectual property (IP) devices and/or instruments. In that IPs/instruments may be quite similar, the two terms may be used interchangeably herein. Further, since IPs and instruments may be used as components of a system-on-chip, IPs and instruments may be more generally referred to herein as components. In other embodiments, in systems according to other standards, components 210 may include other types of components.

The components 210 may include one or more hierarchy-enabling components. A hierarchy-enabling component is a component that supports dynamic modification of the scan path of the system-on-chip (e.g., by dynamically activating/deactivating one or more hierarchical levels of components of the testing scan path of the system-on-chip). In general, hierarchy improves testing of components of a system-on-chip. For example, hierarchy enables minimization of the active system scan path and isolation of components during testing, thereby reducing access time to components of a system-on-chip). The use of hierarchy-enabling components in a system-on-chip may be better understood with respect to FIG. 3.

Figure 3:
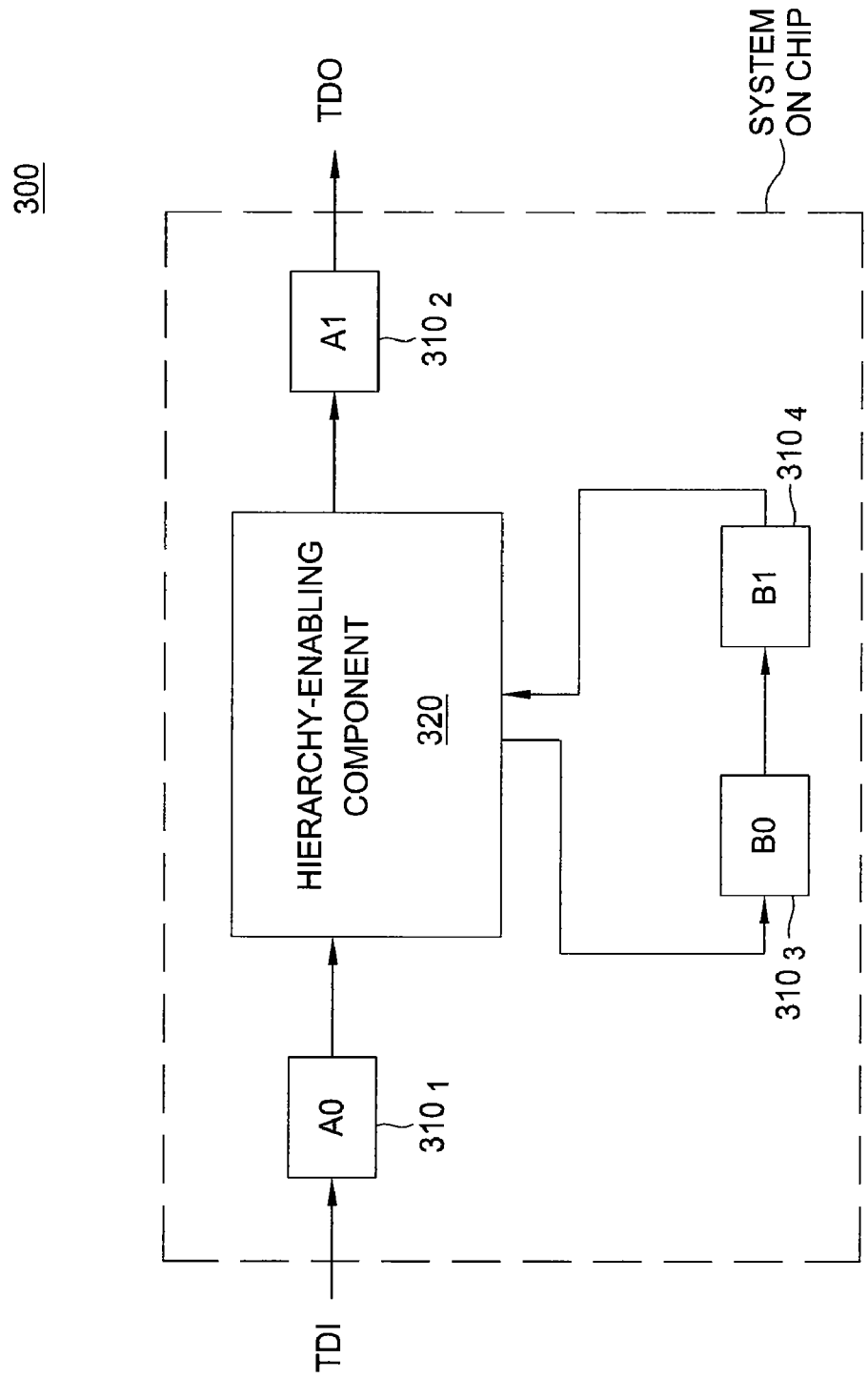
FIG. 3 depicts a high-level block diagram of an exemplary system-on-chip with a hierarchical scan path including two hierarchical levels controlled by a hierarchy-enabling component.

FIG. 3 depicts a high-level block diagram of an exemplary system-on-chip with a hierarchical scan path including two hierarchical levels controlled by a hierarchy-enabling component. Specifically, the system-on-chip 300 of FIG. 3 includes a first testing component $310_1$ (denoted as component A0) and a second testing component $310_2$ (denoted as component A1) interconnected via a hierarchy-enabling component 320 that dynamically controls access to a third testing component $310_3$ (denoted as component B0) and a fourth testing component $310_4$ (denoted as component B1). The first and second testing components $310_1$ and $310_2$, and the hierarchy-enabling component 320, form a first hierarchical level of the testing scan path. The third and fourth testing components $310_3$ and $310_4$ form a second hierarchical level of the testing scan path.

The hierarchy-enabling component 320 can be selected to activate the second hierarchical level of the active testing scan path (i.e., to add the second hierarchical level to the active testing scan path) and deselected to deactivate the second hierarchical level of the active testing scan path (i.e., to remove the second hierarchical level from the active testing scan path). For example, when hierarchy-enabling component 320 is deselected, hierarchy-enabling component 320 operates as a pass-through component such that the testing scan path includes: TDI→A0→HC→A1→TDO. For example, when hierarchy-enabling component 320 is activated, hierarchy-enabling component 320 adds the second hierarchical level to the active testing scan path such that the testing scan path includes the following sequence: TDI, A0, HC, B0, B1, HC, A1, TDO. The hierarchy-enabling component 320 may be implemented in any manner adapted for dynamically modifying a hierarchy of a testing scan path of a system-on-chip.

The hierarchy-enabling component 320 is any component adapted for supporting dynamic modification of a scan path. In one embodiment, for example, hierarchy-enabling component 320 may include a modified version of the Select Instrument Bit (SIB) of the proposed IEEE P1687 standard. The hierarchy-enabling component 320 may also include a more complex hierarchy-enabling component (referred to herein as crossroad devices). For purposes of clarity in describing use of separate testing and control scan paths, separate testing and control scan paths are primarily depicted and described herein within the context of an embodiment in which the hierarchy-enabling components are implemented as modified versions of the SIB cell of the proposed IEEE P1687 standard (however, implementation of separate testing and control scan paths is not limited to use of modified SIBs).

As depicted in FIG. 3, in addition to supporting the testing scan path (including A0, HC, A1, B0 and B1), the system-on-chip 300 also supports a control scan path (omitted from FIG. 3 for purposes of clarity in describing the testing scan path). As described herein, system-on-chip 300 receives testing bitstreams and control bitstreams (from the testing system) via the TDI input and returns testing bitstreams and control bitstreams (to the testing system) via the TDO output. The system-on-chip 300 uses a testing controller (omitted for purposes of clarity) to control the separate testing and control scan paths. The implementation of the control scan path on a system-on-chip, and use of the control scan path to dynamically control modification of the testing scan path, may be better understood with respect to FIG. 5-FIG. 9.

Figure 4:
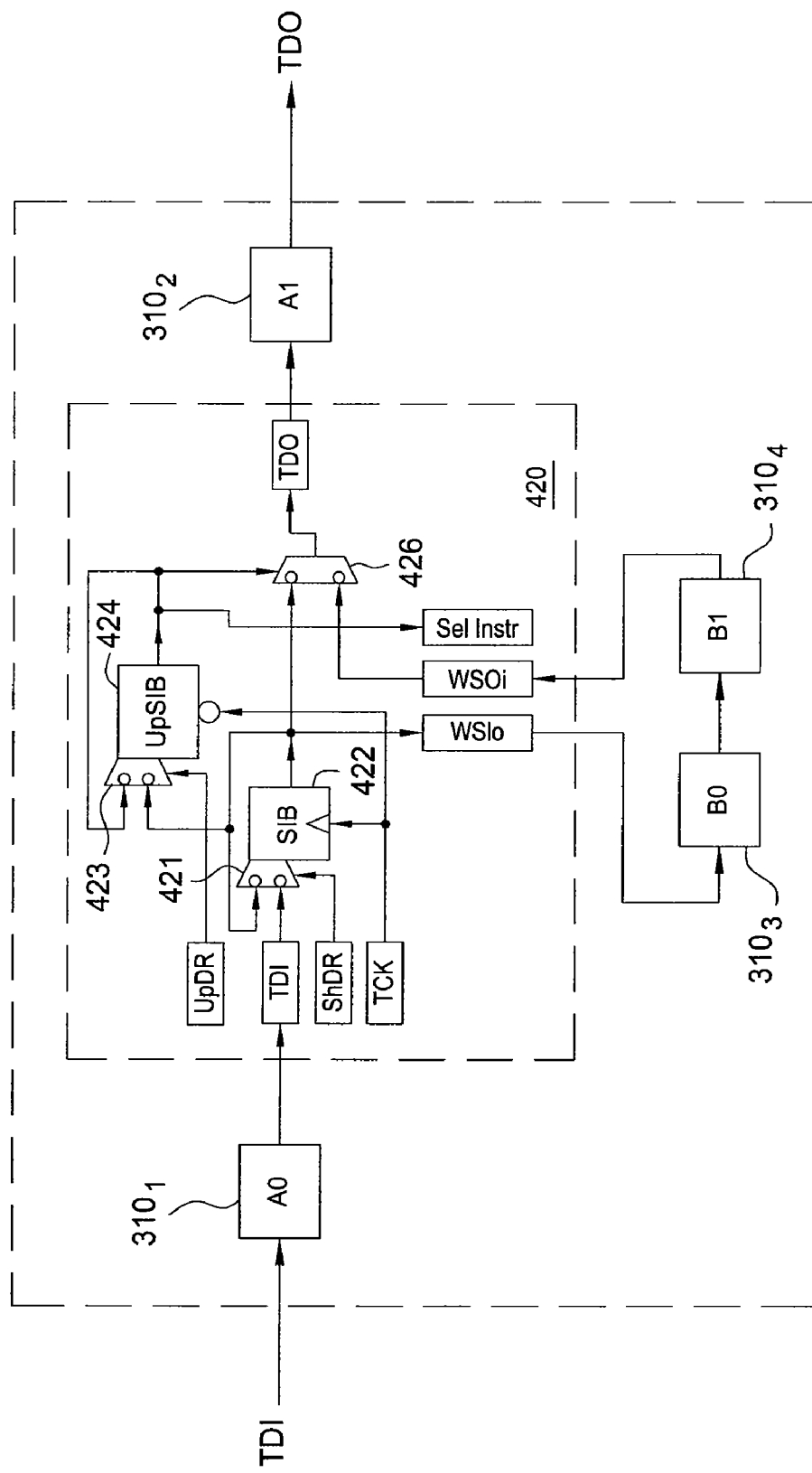
FIG. 4 depicts a high-level block diagram of a system-on-chip including a hierarchy-enabling component adapted for dynamically modifying a scan path of a system-on-chip.

FIG. 4 depicts a high-level block diagram of a system-on-chip including a hierarchy-enabling component adapted for dynamically modifying a scan path of a system-on-chip. Specifically, the system-on-chip 400 represents an implementation of the system-on-chip 300 of FIG. 3, in which the hierarchy-enabling component 320 is implemented as a Select Instrument Bit (SIB) cell as defined in the proposed IEEE P1687 standard. Specifically, system-on-chip 400 of FIG. 4 includes an SIB cell 420 operating as a hierarchy-enabling component.

As depicted in FIG. 4, SIB cell 420 supports a first hierarchical level of the testing scan path (via a TDI input and a TDO output) and a second hierarchical level of the testing scan path (via a WSIo port which is coupled to the TDI input of boundary scan cell B) and a WSOi port which is coupled to the TDO output from boundary scan cell B1). The SIB cell 420 includes a Select Instrument Bit (SIB) register 422, an Update SIB (UpSIB) register 424, and an output MUX 426. The SIB register 422 has an associated SIB input MUX 421 controlling inputs to SIB register 422. The UpSIB register 424 has an associated UpSIB input MUX 423 controlling inputs to UpSIB register 424.

The SIB input MUX 421 associated with the SIB register 422 controls input to SIB register 422. The SIB input MUX 421 includes two input ports. The SIB input MUX 421 accepts as inputs the TDI input (e.g., from a previous component in the scan path) and the output of the SIB register 422. The SIB input MUX 421 is controlled by a Shift DR (ShDR) control signal, which is applied to a control port of the SIB input MUX 421. When the ShDR control signal is "1", SIB input MUX 421 passes the signal from the TDI input into SIB register 422. When the ShDR control signal is "0", SIB input MUX 421 passes the signal from the output of SIB register 422 into SIB register 422.

The SIB register 422 accepts input from the output of SIB input MUX 421. The SIB register 422 is controlled by a clock signal (denoted as TCK) applied to a control port of SIB register 422. The output of the SIB register 422 is coupled to each of the following: an input to the SIB input MUX 421, an input to the UpSIB input MUX 423, an input to the output MUX 426, and the WSIo port (which provides access to components of a second (or lower) hierarchical level for propagating signals to the second hierarchical level when the second hierarchical level is selected to be activated).

The UpSIB input MUX 423 associated with the UpSIB register 424 controls input to UpSIB register 424. The UpSIB input MUX 423 includes two input ports. The UpSIB input MUX 423 accepts as inputs the output from the SIB register 422 and the output from the UpSIB register 424. The UpSIB input MUX 423 is controlled by an Update DR (UpDR) control signal applied to a control port of the UpSIB input MUX 423. When the UpDR control signal is "1", UpSIB input MUX 423 passes the signal from the output of SIB register 422 into UpSIB register 424. When the UpDR control signal is "0", UpSIB input MUX 423 passes the signal from the output of UpSIB register 424 into UpSIB register 424.

The UpSIB register 424 accepts input from the output of UpSIB input MUX 423. The UpSIB register 424 is controlled by a clock signal (denoted as TCK) applied to a control port of UpSIB register 424. The output of the UpSIB register 424 is coupled to each of the following: an input to the UpSIB input MUX 423, a control port of the output MUX 426, and a Select_Instr signaling path. The application of the output of the UpSIB register 424 to the control port of the output MUX 426 enables control of the hierarchy of the testing scan path (i.e., enabling dynamic selection/deselection of the second (or lower) hierarchical level such that the second hierarchical level is dynamically activated/deactivated).

The output MUX 426 includes two input ports. The output MUX 426 accepts as inputs the output from the SIB register 422 and the input from the lower hierarchical level via the WSOi port (which, in this example, is the TDO output of boundary scan cell B1). The output of output MUX 426 is coupled to the TDO output of SIB cell 420 (for propagation to a subsequent component in the first hierarchical level of the scan path, which, in this example, is boundary scan cell A1). The output of output MUX 426 is determined by a control signal applied to a control port of the output MUX 426. The output of the UpSIB register 424 is coupled to the control port of output MUX 416.

As depicted in FIG. 4, the value of UpSIB register 424 determines whether the second hierarchical level is selected (i.e., part of the scan path) or deselected (i.e., not part of the scan path). When the second hierarchical level is deselected (i.e., the value of UpSIB register 424 is "0") the output MUX 426 passes the output of the SIB register 422 to the TDO output of SIB cell 420, and the value from the WSOi port is ignored. When the second hierarchical level is selected (i.e., the value of UpSIB register 424 is "1"), output MUX 426 passes the signal from the lower hierarchical level (i.e., from the WSOi port) to the TDO output of SIB cell 420.

As described herein, in addition to supporting the testing scan path (including A0, SIB, A1, B0, and B1), the system-on-chip 400 also supports a control scan path (omitted from FIG. 4 for purposes of clarity in describing the testing scan path). The system-on-chip 400 uses a testing controller (omitted for purposes of clarity) to control the separate testing and control scan paths. The implementation of the control scan path on a system-on-chip, and use of the control scan path to dynamically control modification of the testing scan path, may be better understood with respect to FIG. 5-FIG. 9.

Figure 5:
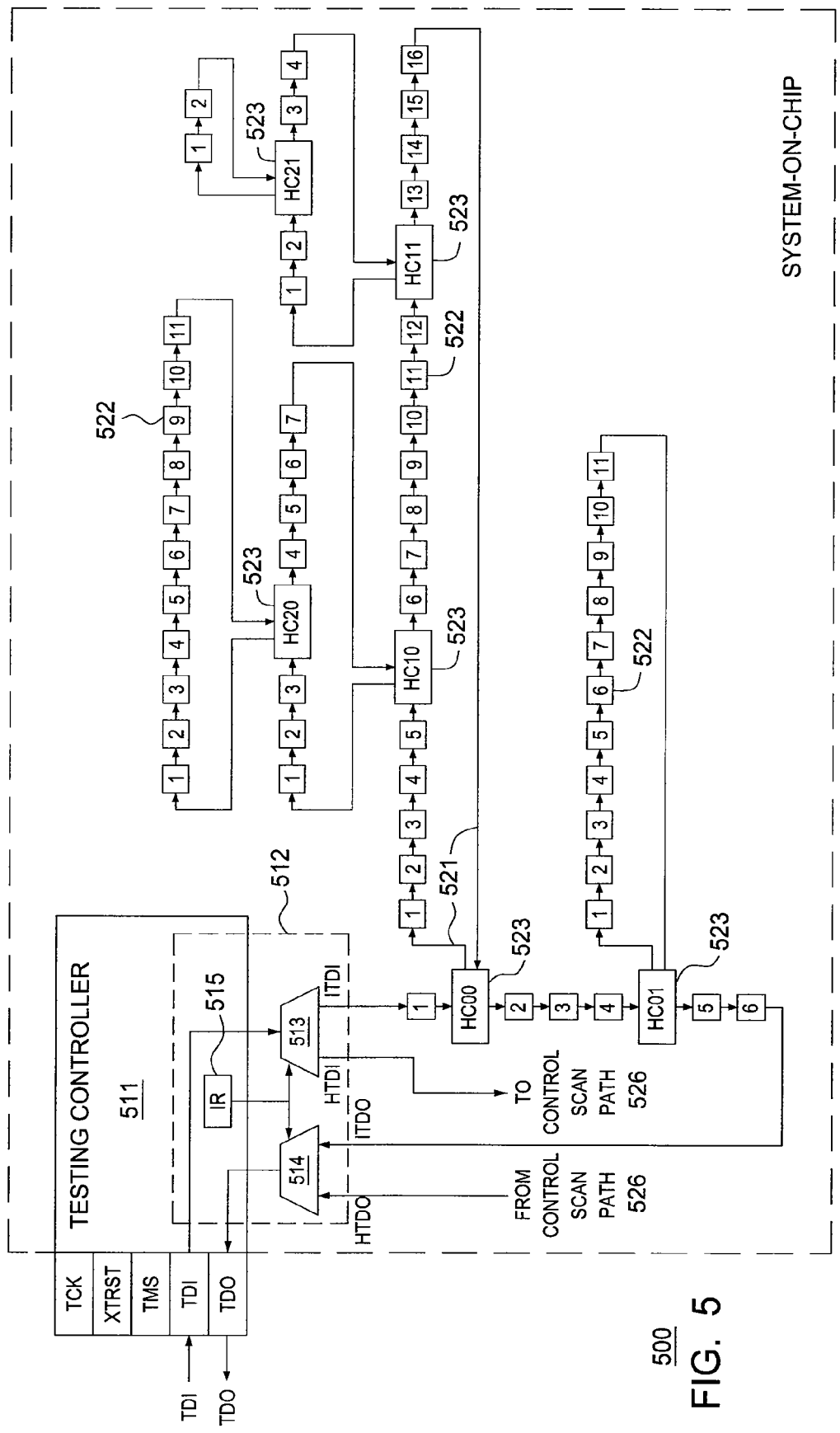
FIG. 5 depicts a high-level block diagram of a hierarchical system-on-chip including a testing controller and a hierarchical testing scan path.

FIG. 5 depicts a high-level block diagram of a hierarchical system-on-chip including a testing controller and a hierarchical testing scan path. The testing controller 511 controls testing of system-on-chip 500. The system-on-chip 500 supports a hierarchical testing scan path (denoted as testing scan path 521) and a control scan path (which is denoted as control scan path 526, but omitted from FIG. 5 for purposes of clarity because, as described herein, the separate control scan path may be implemented in a number of different ways, as depicted and described herein with respect to FIG. 6-FIG. 9).

As depicted in FIG. 5, in one embodiment testing controller 511 is an 1149.1 JTAG TAP testing controller supporting TCK, XTRST, TMS, and input/output signals. The testing controller 511 supports an external input (TDI) that is coupled to an output of a testing system (such as TS 120 of FIG. 1) and an external output (TDO) that is coupled to an input to a testing system (such as TS 120 of FIG. 1). The testing controller 511 supports an internal input that is coupled to control logic adapted for controlling application of input bitstreams from the external TDI input to the testing scan path 521 and the control scan path 526. The testing controller 511 supports an internal output that is coupled to control logic adapted for controlling selection of output bitstreams from testing scan path 521 and control scan path 526 (to be provided to the external TDO output).

As depicted in FIG. 5, since system-on-chip 500 supports two scan paths to which bitstreams must be applied in order to test system-on-chip 500 (namely, testing scan path 521 and control scan path 526), system-on-chip 500 supports two internal inputs and two internal outputs within system-on-chip 500. The system-on-chip 500 supports a first internal input (ITDI) that is coupled to an input to the testing scan path 521 and a first internal output (ITDO) that is coupled to an output from the testing scan path 521. The system-on-chip 500 supports a second internal input (HTDI) that is coupled to an input to the control scan path 526 and a second internal output (HTDO) that is coupled to an output from the control scan path 526.

The system-on-chip 500 includes an input control DEMUX 513. The input control DEMUX 513 includes an input port coupled to the TDI port of testing controller 511. The input control DEMUX includes two output ports: a first output port coupled to the input to testing scan path 521 (denoted as ITDI) and a second output port coupled to the input to control scan path 526 (denoted as HTDI). The testing controller 511 applies an input bitstream that is received at the TDI input of system-on-chip 500 to an input port of the input control DEMUX 513. The input control DEMUX 513 is adapted to couple the input bitstream received via the TDI input to the testing scan path 521 or to the control scan path 526 as desired/needed.

The system-on-chip 500 includes an output control MUX 514. The output control MUX 514 includes two input ports: a first input port coupled to the output from testing scan path 521 (denoted as ITDO) and a second input port coupled to the output from control scan path 526 (denoted as HTDO). The output control MUX 514 includes an output port coupled to the TDO port of testing controller 511. The output control MUX 514 is adapted to couple the output bitstream from the testing scan path 521 or the output bitstream from the control scan path 526 to the TDO output (via testing controller 511) as desired/needed.

The input control DEMUX 513 and output control MUX 514 are each controlled by an internal register (IR) 515. The IR 515 is loaded with control values, as desired/needed, to control input control DEMUX 513 and output control MUX 514. The control values may be loaded into IR 515 by testing controller 511 (e.g., using control signals received from an associated testing system, such as TS 120 of FIG. 1). Although IR 515 is depicted and described as being included within testing controller 511, in other embodiments IR 515 may be implemented outside of testing controller 511. Although primarily depicted and described with respect to one IR, in other embodiments two (or more) IRs may be used (e.g., one controlling input control DEMUX 513 and another controller output control MUX 514).

The output of internal register 515 is coupled to a control port of input control DEMUX 513 to control application of input bitstreams to testing scan path 521 and control scan path 526 (i.e., to decide, for each input bit value, whether to apply that input bit value to testing scan path 521, control scan path 526, or both testing scan path 521 and control scan path 526. The output of internal register 515 is coupled to a control port of output control MUX 514 to control selection of output bitstreams from testing scan path 521 and control scan path 526 (i.e., to decide, for each output bit slot, whether to select the output bit value available from testing scan path 521 or to select the output bit value available from control scan path 526).

The input control DEMUX 513, output control MUX 514, and IR 515 may be collectively referred to herein as control logic 512.

Although primarily depicted and described herein with respect to an embodiment in which an input control DEMUX is used to control application of input bitstreams to testing scan path 521 and control scan path 526, in other embodiments the input control DEMUX may be omitted. In one embodiment, for example, the input testing bitstream may simply be applied to both the testing scan path 521 and the control scan path 526. In this embodiment, the output of IR 515 is only coupled to the control port of output control MUX 514. Although primarily depicted and described herein with respect to using control DEMUXs and control MUXs, separate testing and control scan paths may be implemented using other types of control logic.

As depicted in FIG. 5, the testing scan path 521 includes sixty-three components. The testing scan path 521 includes fifty-seven non-hierarchy-enabling testing components 522 (denoted using integer numbers) and six hierarchy-enabling components 523 (denoted as hierarchy-enabling components HC00, HC01, HC10, HC11, HC20, and HC21). As depicted in FIG. 5, the sixty-three components of testing scan path 521 are arranged serially and include four hierarchical levels. The hierarchy-enabling components HC00 and HC01 provide access from a first hierarchical level to a second hierarchical level. The hierarchy-enabling components HC10 and HC11 provide access from the second hierarchical level to a third hierarchical level. The hierarchy-enabling components HC20 and HC21 provide access from the third hierarchical level to a fourth hierarchical level.

The hierarchy-enabling components may be dynamically controlled as desired/needed to modify testing scan path 521 (i.e., to add/remove hierarchical levels to/from the active testing scan path 521). For example, when the hierarchy-enabling components HC00 and HC01 are deselected, the active testing scan path 521 is: TDI, 1, HC00, 2, 3, 4, H001, 5, 6, TDO. For example, when HC00 is selected (while HC10, HC11 and HC01 each remain deselected), the active testing scan path 521 is: TDI, 1, HC00, 1, 2, 3, 4, 5, HC10, 6, 7, 8, 9, 10, 11, 12, HC11, 13, 14, 15, 16, HC00, 2, 3, 4, HC01, 5, 6, TDO. In this manner, different hierarchical levels of the testing scan path 521 may be dynamically activated or deactivated to be added to or removed from the active testing scan path 521 by dynamically selecting or deselecting different hierarchy-enabling components.

The control of one or more hierarchy-enabling components in a manner for dynamically modifying the testing scan path is implemented using a control scan path that is separate from the testing scan path. The separate testing and control scan paths may be implemented in any manner.

In one embodiment, the testing scan path and control scan path may be implemented using separate physical components. In one embodiment, for example, the testing scan path includes a plurality of non-hierarchical testing components and at least one hierarchical testing component, and the control scan path includes at least one hierarchical control component. In such an embodiment, the at least one hierarchical control component which forms the control scan path interacts with the at least one hierarchical testing component which forms part of the testing scan path in order to dynamically control modification of the testing scan path. This embodiment may be better understood with respect to the example depicted and described with respect to FIG. 6 and FIG. 7.

In one embodiment, the testing scan path and control scan path may be implemented using combined physical components. In one embodiment, for example, the system-on-chip includes a plurality of non-hierarchical testing components and at least one hierarchy-enabling component. The non-hierarchy-enabling testing components and the at least one hierarchy-enabling component (i.e., a first portion of each of the at least one hierarchy-enabling component) form a testing scan path. The at least one hierarchy-enabling component (i.e., a second portion of each of the at least one hierarchy-enabling component) form a control scan path. The respective first and second portions of each of the at least one hierarchy-enabling component interact in order to dynamically control modification of the testing scan path. This embodiment may be better understood with respect to the example depicted and described with respect to FIG. 8 and FIG. 9.

Figure 6:
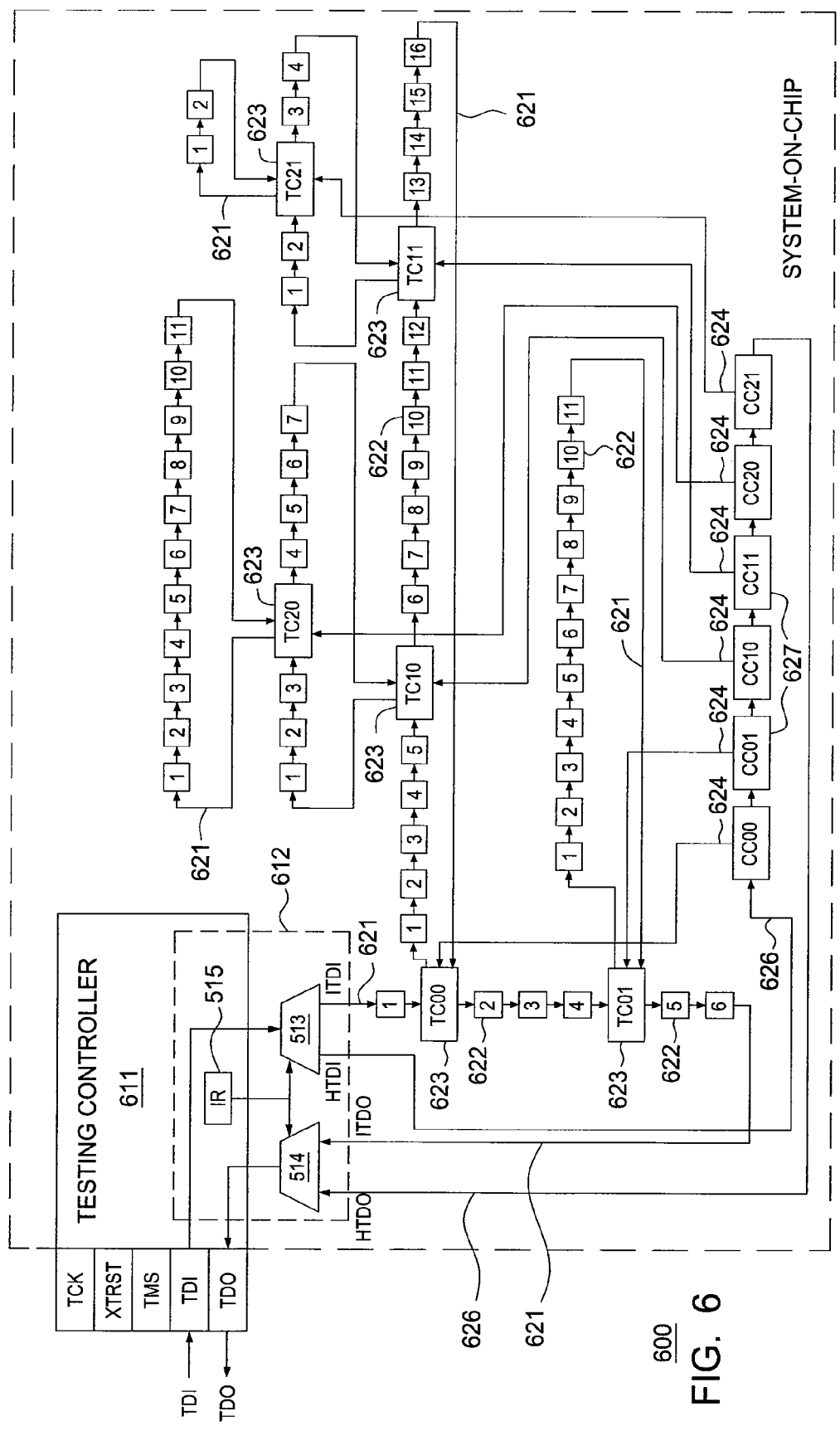
FIG. 6 depicts a high-level block diagram of a system-on-chip including a testing scan path and a control scan path realized using separate physical components.

FIG. 6 depicts a high-level block diagram of a system-on-chip including a testing scan path and a control scan path realized using separate physical components. The system-on-chip 600 comprises an implementation of the system-on-chip 500 depicted and described with respect to FIG. 5. The system-on-chip 600 of FIG. 6 includes a testing controller 611, which operates in a manner similar to testing controller 511 of FIG. 5. The system-on-chip further includes control logic 612 which operates in a manner similar to control logic 512 of FIG. 5. The system-on-chip 600 includes a testing scan path 621 and a control scan path 626, each of which may be independently accessed by testing controller 611 for purposes of testing system-on-chip 600.

The testing scan path 621 is used to perform testing on system-on-chip 600. The testing scan path 621 is composed of a plurality of non-hierarchy-enabling testing components 622 (collectively, non-hierarchy-enabling components 622, which may also be referred to as non-hierarchy-enabling components) and a plurality of hierarchy-enabling testing components 623 (collectively, hierarchy-enabling testing components 623, which may also be referred to as hierarchy-enabling components). A non-hierarchy-enabling testing component 622 is a component that does not support a capability to dynamically modify testing scan path 621 of system-on-chip 600. A hierarchy-enabling testing component 623 is a component that does support a capability to dynamically modify testing scan path 621 of system-on-chip 600.

As depicted in FIG. 6, the testing scan path 621 includes sixty-three components, including fifty-seven non-hierarchy-enabling testing components (denoted using integer numbers) and six hierarchy-enabling testing components (denoted as hierarchy-enabling testing components TC00, TC01, TC10, TC11, TC20, and TC21). The sixty-three components of testing scan path 621 are arranged serially, and include four hierarchical levels. The hierarchy-enabling testing components TC00 and TC01 provide access from a first hierarchical level to a second hierarchical level. The hierarchy-enabling testing components TC10 and TC11 provide access from the second hierarchical level to a third hierarchical level. The hierarchy-enabling testing components TC20 and TC21 provide access from the third hierarchical level to a fourth hierarchical level.

The control scan path 626 is an additional scan path added to system-on-chip 600 (in addition to a system scan path typically available on a system-on-chip which is now being used as testing scan path 621). The control scan path 626 is adapted for dynamically controlling the testing scan path 621 of the system-on-chip 600. The control scan path 626 includes a plurality of hierarchy control components 627 (collectively, hierarchy control components 627). A hierarchy control component 627 is a component that is adapted to control at least one hierarchy-enabling testing component 623 to dynamically modify testing scan path 621 of system-on-chip 600.

As depicted in FIG. 6, control scan path 626 includes six hierarchy control components (denoted as hierarchy control components CC00, CC01, CC10, CC11, CC20, and CC21). The six hierarchy control components of control scan path 626 are arranged serially. The six hierarchy control components which form control scan path 626 (illustratively, CC00, CC01, CC10, CC11, CC20, and CC21) are coupled to the six hierarchy-enabling testing components which form part of testing scan path 621 (illustratively, TC00, TC01, TC10, TC11, TC20, and TC21) using six coupling paths 624 (which may be collectively referred to as coupling paths 624), respectively, for controlling the six hierarchy-enabling testing components in a manner enabling dynamic modification of testing scan path 621 of system-on-chip 600.

The testing controller 611 interfaces with testing scan path 621 and control scan path 626 using control logic 612 (in a manner similar to that depicted and described with respect to FIG. 5). A testing system (omitted for purposes of clarity) can perform testing on system-on-chip 600 using input testing vectors and input control vectors. An input testing vector is a testing bitstream which is applied to the testing scan path 621. An input control vector is a control bitstream which is applied to the control scan path 626 for controlling the hierarchy of testing scan path (i.e., for dynamically controlling the testing components of testing scan path 621 through which the input testing vector propagates). The application of the input testing vector to the testing scan path 621 results in an output testing vector being received by testing controller 611 from testing scan path 621 via the internal ITDO output coupled to the output of testing scan path 621. The testing controller 611 propagates the output testing vector to the testing system, which processes the output testing vector in order to determine testing results.

As described herein, in an embodiment in which the testing scan path and the control scan path are realized using separate physical components (such as depicted and described herein with respect to FIG. 6), the hierarchy-enabling testing components and associated hierarchy control components may be implemented using any hierarchy-enabling components (e.g., using a modified version of the SIB cell defined in the proposed IEEE P1687 standard, using other hierarchy-enabling components (e.g., crossroad devices), and the like, as well as various combinations thereof). An exemplary embodiment in which the hierarchy-enabling testing components and the associated hierarchy control components are implemented using a modified version of the SIB cell of the proposed IEEE P1687 standard is depicted and described with respect to FIG. 7.

Figure 7:
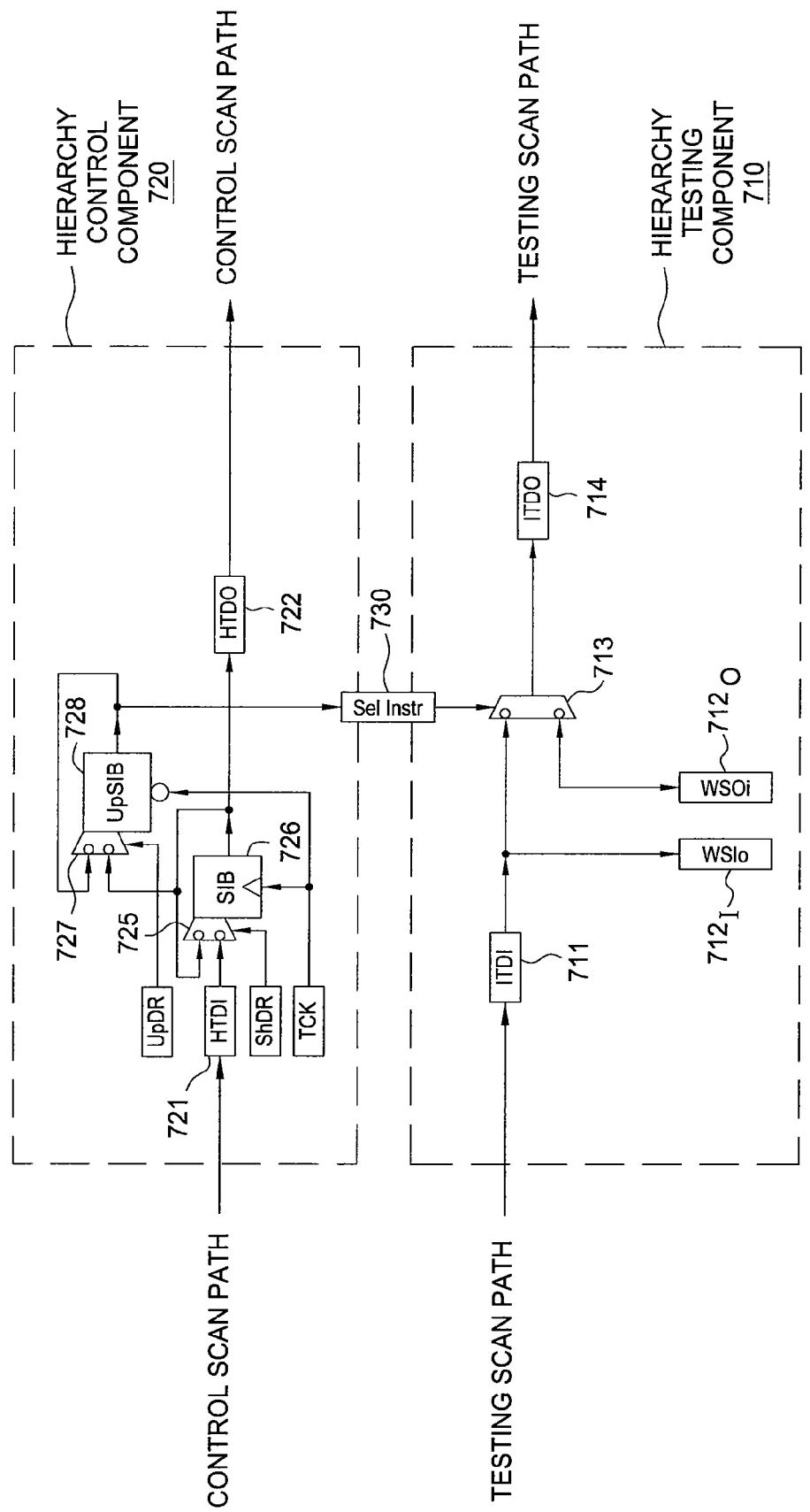
FIG. 7 depicts a high-level block diagram of a hierarchy-enabling testing component and a hierarchy control component adapted for use in the testing scan path and the control scan path of the system-on-chip of FIG. 6.

FIG. 7 depicts a high-level block diagram of a hierarchy-enabling testing component and a hierarchy control component adapted for use in the testing scan path and the control scan path of the system-on-chip of FIG. 6. As depicted in FIG. 7, a hierarchy-enabling testing component 710 and a hierarchy control component 720 cooperate to support dynamic modification of a testing scan path of a system-on-chip (e.g., such as testing scan path 621 depicted and described with respect to FIG. 6).

As depicted and described with respect to FIG. 6, hierarchy-enabling testing component 710 forms part of a testing scan path (illustratively, testing scan path 621) and hierarchy control component 720 forms part of a control scan path (illustratively, control scan path 626). For example, hierarchy-enabling testing component 710 may be one of the hierarchy-enabling testing components 623 of FIG. 6 (e.g., hierarchy-enabling testing component TC00) and hierarchy control component 720 may be one of the hierarchy control components 627 of FIG. 6 (e.g., hierarchy control component CC00 which controls the hierarchy-enabling testing component TC00).

As described herein, the hierarchy-enabling testing component 710 and the hierarchy control component 720 may be implemented in any manner for supporting dynamic modification of a scan path using separate testing and control scan paths. As depicted in FIG. 7, in one embodiment, hierarchy-enabling testing component 710 and hierarchy control component 720 may be implemented by reusing a portion of the design of an SIB cell as defined in the proposed IEEE P1687 standard (although it may be noted that this example implementation is provided for purposes of clarity and the hierarchy-enabling testing component 710 and the hierarchy control component 720 may be implemented using any hierarchy-enabling component(s)). The hierarchy-enabling testing component 710 and hierarchy control component 720 are coupled via a signaling path 730 (denoted as the Sel_Instr signaling path). The Sel_Instr signaling path 730 corresponds to one of the coupling paths 624 of FIG. 6.

As depicted in FIG. 7, hierarchy-enabling testing component 710 includes a TDI input 711, a WSIo input $712_I$, a WSOi output $712_O$, a MUX 713, and a TDO output 714. The TDI input 711 is coupled to an output of the preceding component in the testing scan path (omitted for purposes of clarity) and the TDO output 714 is coupled to an input of the subsequent component in the testing scan path (omitted for purposes of clarity). The TDI input 711 is coupled to a first input port of MUX 713 and to WSIo input $712_I$. The WSOi output $712_O$ is coupled to a second input port of MUX 713. The selection between signals from TDI input 711 and signals from WSOi output 712$_O$ at MUX 713 is controlled by selection signals applied to a control port of MUX 713 from hierarchy control component 720.

As depicted in FIG. 7, hierarchy control component 720 is similar to SIB cell 420 of FIG. 4, however, the TDI input and TDO output (which, as described with respect to hierarchy-enabling testing component 710, are reserved for the testing scan path) have been replaced by an HTDI input 721 and an HTDO output 722 (for the control scan path). The HTDI input 721 is coupled to an output of a preceding component in the control scan path (omitted for purposes of clarity) and the HTDO output 722 is coupled to an input of a subsequent component in the control scan path (omitted for purposes of clarity).

As depicted in FIG. 7, hierarchy control component 720 includes a SIB input MUX 725, a SIB register 726, an UpSIB input MUX 727, and an UpSIB register 728.

The SIB input MUX 725 and SIB register 726 operate in a manner similar to SIB input MUX 421 and SIB register 422 of FIG. 4, with a few differences. The first difference is that the TDI input to SIB input MUX 421 is replaced by the HTDI input 721 to SIB input MUX 725. The second difference is that the output from SIB register 726 is connected to HTDO output 722 (rather than in the SIB cell 420, in which the output of SIB register 422 is coupled to an input to output MUX 426).

The UpSIB input MUX 727 and UpSIB register 728 operate in a manner similar to UpSIB input MUX 423 and UpSIB register 424 of FIG. 4, with a one difference. The difference is that, while the output of UpSIB register 728 is still coupled to the Sel_Instr signaling path, the output of UpSIB register 728 is not coupled as a control signal to an output MUX (since output MUX 426 is not present in hierarchy control component 720).

As depicted in FIG. 7, the output of the UpSIB register 728 is coupled to the Sel_Instr signaling path 730. The Sel_Instr signaling path 730 from the output of UpSIB register 728 is coupled to the control port of MUX 713 of the hierarchy-enabling testing component 710. The Sel_Instr signaling path 730 from the hierarchy control component 720 to the hierarchy-enabling testing component 710 enables hierarchy control component 720 to control selection between signals from TDI input 711 and signals from WSOi output 712$_O$ to be passed to TDO output 714 (i.e., dynamically controlling the addition/removal of testing components from the active testing scan path).

As depicted in FIG. 7, when the UpSIB register 728 of hierarchy control component 720 is activated (e.g., set to "1"), the signal is propagated from the UpSIB register 728 of hierarchy control component 720 to the control port of the MUX 713 of hierarchy-enabling testing component 710 via the Sel_Instr signaling path 730. Upon receiving the activation signal, the MUX 713 of hierarchy-enabling testing component 710 switches from selecting the signal from TDI input 711 to selecting the signal from WSOi output 712$_O$. In this manner, the hierarchy-enabling testing component 710 no longer acts as a pass-through for signals from TDI input 711. Rather, any component(s) connected to WSIo input 712$_I$ and WSOi output 712$_O$ are dynamically added to the active testing scan path (i.e., the testing scan path is dynamically modified using a combination of the hierarchy control component 720 and hierarchy-enabling testing component 710).

For example, referring back to FIG. 6, assume that hierarchy-enabling testing component 710 is hierarchy-enabling testing component TC00 and that hierarchy control component 720 is hierarchy control component CC00. In this example, while the hierarchy-enabling testing component TC00 is deselected, TC00 passes testing bits from non-hierarchy-enabling testing component 1 to non-hierarchy-enabling testing component 2 (i.e., it operates as a pass-through). In this example, when the hierarchy-enabling testing component TC00 is activated by control signals from the hierarchy control component CC00 (e.g., via the UpSIB register 728 and the Sel_Instr signaling path 730), a next level of the hierarchy is dynamically added to the active testing scan path such that TC00 passes testing bits from non-hierarchy-enabling testing component 1 to non-hierarchy-enabling testing component 1 (via TDIo of TC00), through non-hierarchy-enabling components 2 through 16 and the hierarchy-enabling testing components TC10 and TC11, and then to non-hierarchy-enabling testing component 2 (via TDOi of TC00).

Figure 8:
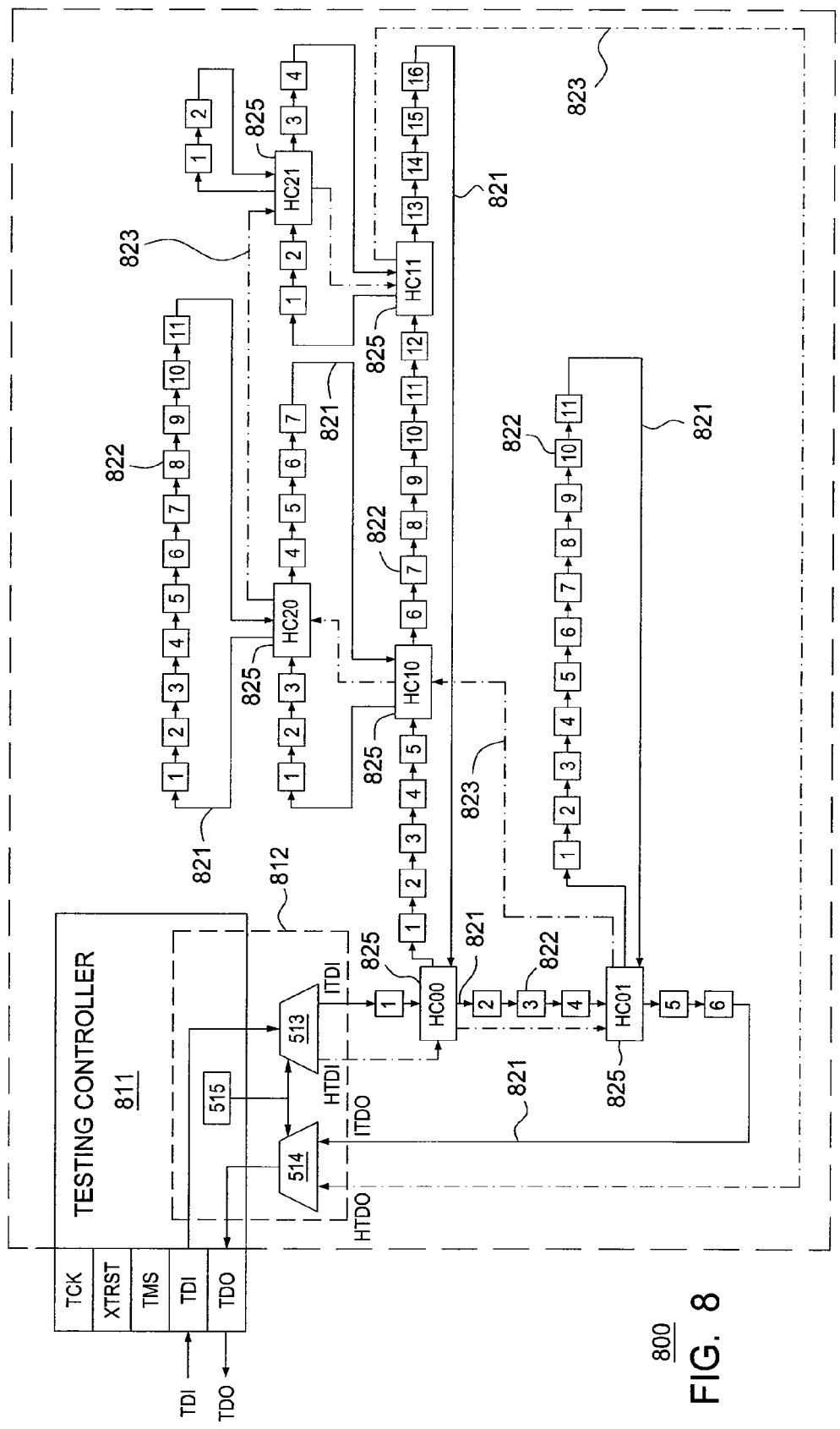
FIG. 8 depicts a high-level block diagram of a system-on-chip including a testing scan path and a control scan path realized using combined physical components.

FIG. 8 depicts a high-level block diagram of a system-on-chip including a testing scan path and a control scan path realized using combined physical component. The system-on-chip 800 comprises an implementation of the system-on-chip 500 depicted and described with respect to FIG. 5. The system-on-chip 800 of FIG. 8 includes a testing controller 811, which operates in a manner similar to testing controller 511 of FIG. 5. The system-on-chip further includes control logic 812 which operates in a manner similar to control logic 512 of FIG. 5. The system-on-chip 800 includes a testing scan path 821 and a control scan path 823, each of which may be independently accessed by testing controller 811 for purposes of testing system-on-chip 600.

The testing scan path 821 is used to perform testing on system-on-chip 800. The testing scan path 821 is composed of a plurality of non-hierarchy-enabling testing components 822 (collectively, non-hierarchy-enabling testing components 822, and which may also be referred to herein as non-hierarchy-enabling components) and a plurality of hierarchy-enabling components 825 (collectively, hierarchy-enabling components 825). The control scan path 823 is composed of the plurality of hierarchy-enabling components 825 (i.e., the hierarchy-enabling components 825 which also form part of testing scan path 821). In other words, each hierarchy-enabling component 825 is adapted for supporting both testing scan path 821 and control scan path 823 in a manner that enables either the testing scan path 821 or the control scan path 823 to dynamically control testing scan path 821).

A non-hierarchy-enabling testing component 822 is a component that does not support a capability to dynamically modify testing scan path 821 of system-on-chip 800. A hierarchy-enabling component 825 is a component that does support a capability to dynamically modify testing scan path 821 of system-on-chip 800. The hierarchy-enabling components 825 may be implemented in any manner. In one embodiment, for example, each hierarchy-enabling component 825 includes a first portion which forms part of the testing scan path 821 and a second portion which forms part of the control scan path 823 (i.e., the testing scan path 821 and the control scan path 823 are supported using a common group of physical components).

The testing scan path 821 includes sixty-three components, including fifty-seven non-hierarchy-enabling testing components (denoted using integer numbers) and six hierarchy-enabling components (denoted as HC00, HC01, HC10, HC11, HC20, and HC21). The sixty-three components of testing scan path 621 include four hierarchical levels. The hierarchy-enabling components HC00 and HC01 provide access from a first hierarchical level to a second hierarchical level. The hierarchy-enabling components HC10 and HC11 provide access from the second hierarchical level to a third hierarchical level. The hierarchy-enabling components HC20 and HC21 provide access from the third hierarchical level to a fourth hierarchical level. The testing scan path 821 may be used to dynamically control the testing scan path 821 (i.e., controlling the addition/removal of hierarchical levels to/from the active testing scan path 821).

The control scan path 823 is an additional scan path added to system-on-chip 800 (in addition to a system scan path typically available on a system-on-chip, which, due to the addition of control scan path 823, is used as testing scan path 821). The control scan path 823 may be used to dynamically control the testing scan path 821 (i.e., controlling the addition/removal of hierarchical levels to/from the active testing scan path 821). The control scan path 823 traverses the hierarchy-enabling components 825 (i.e., the testing scan path 821 and the control scan path 823 share each of the hierarchy-enabling components 825). The control portions of hierarchy-enabling components 825 control the respective testing portions of hierarchy-enabling components 825 (internally) in a manner that enables dynamic modification of testing scan path 821 of system-on-chip 800.

As depicted in FIG. 8, the control scan path 823 is formed using the following sequence of components: HC00→HC01→HC10→HC20→HC21→HC11. The sequence of components of control scan path 823 is merely one example of a sequence of hierarchy-enabling components 825 which may be used (i.e., since the testing controller 811 can apply control bits to the control scan path 823 in any order, the hierarchy-enabling components 825 may be connected in any sequence to form the control scan path 823). For example, an alternative sequence of HTDI, HC20, HC21, HC11, HC10, HC00, HC01, HTDI may be used for control scan path 823. Similarly, for example, an alternative sequence of HTDI, HC21, HC10, HC00, HC11, HC20, HC01, HTDI may be used for control scan path 823.

The testing controller 811 interfaces with testing scan path 821 and control scan path 823 using control logic 812 (in a manner similar to that depicted and described with respect to FIG. 5). A testing system (omitted for purposes of clarity) can perform testing on system-on-chip 800 using input testing vectors and input control vectors. An input testing vector is a testing bitstream which is applied to the testing scan path 821 for performing one or more tests (and, optionally, for controlling the hierarchy of testing scan path 821). An input control vector is a control bitstream which is applied to the control scan path 823 for controlling the hierarchy of testing scan path (i.e., for dynamically controlling the testing components of the testing scan path 821 through which the input testing vector propagates). The application of the input testing vector to the testing scan path 821 results in an output testing vector being received by testing controller 811 from testing scan path 821 via the internal ITDO output coupled to the output of testing scan path 821. The testing controller 811 propagates the output testing vector to the testing system, which processes the output testing vector in order to determine testing results.

As depicted and described with respect to FIG. 8, sharing of physical components by testing scan path 821 and control scan path 823 provides two means by which the hierarchy of testing scan path 821 may be modified (i.e., by accessing the hierarchy-enabling components 825 via testing scan path 821 or by accessing the hierarchy-enabling components 825 via control scan path 823. This enables the testing system to decide which of the two means of accessing the hierarchy-enabling components 825 is more advantageous at any given moment in time, and to control the hierarchy of the testing scan path 821 using the more advantageous means of access.

As described herein, in an embodiment in which the testing scan path and the control scan path are realized by sharing physical components (such as depicted and described herein with respect to FIG. 8), the hierarchy-enabling components may be implemented using any hierarchy-enabling components (e.g., using a modified version of the SIB cell defined in the proposed IEEE P1687 standard, using other hierarchy-enabling components (e.g., crossroad devices), and the like, as well as various combinations thereof). An exemplary embodiment in which the hierarchy-enabling components are implemented using a modified version of the SIB cell defined in the proposed IEEE P1687 standard is depicted and described with respect to FIG. 9.

Figure 9:
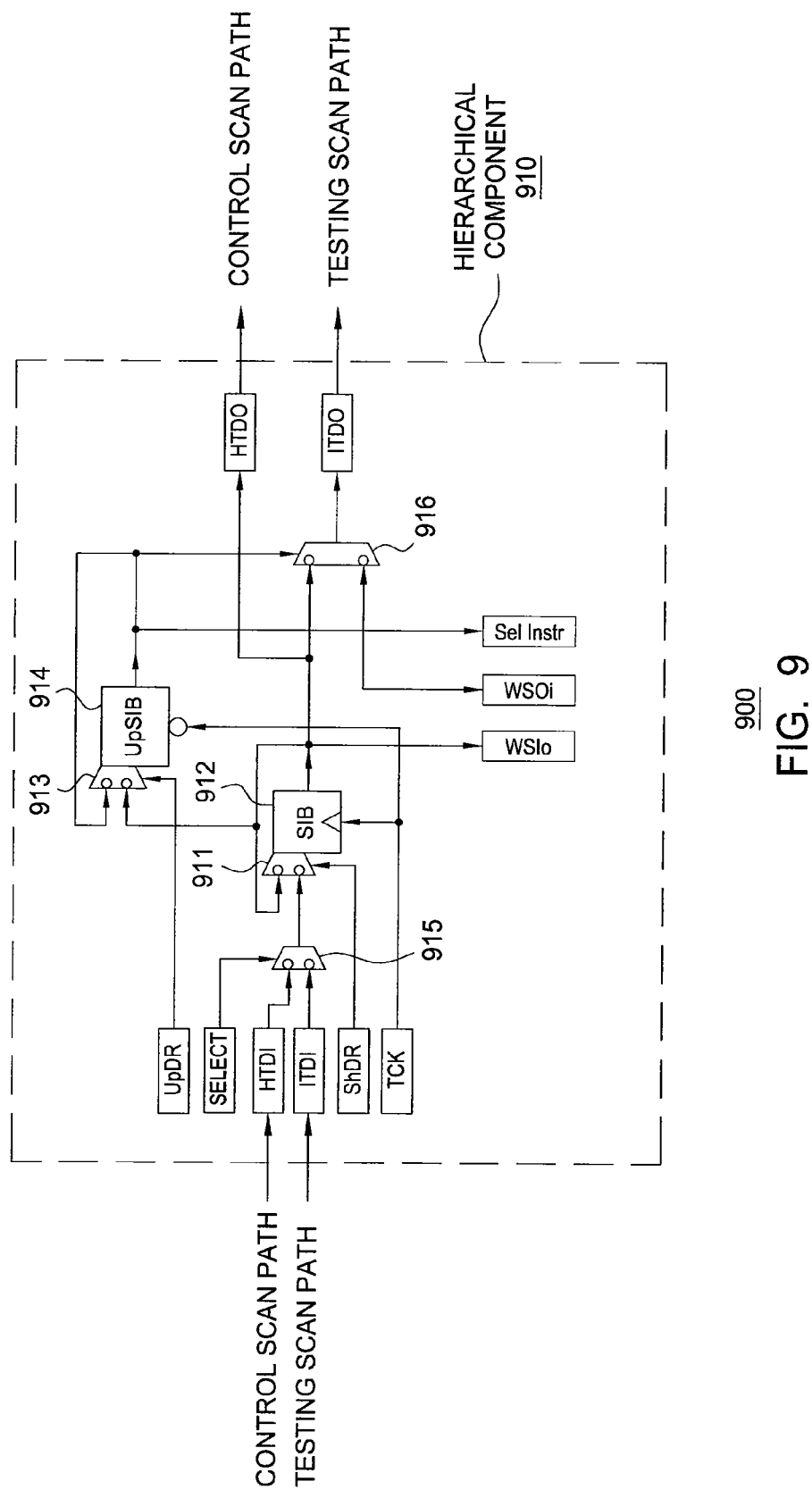
FIG. 9 depicts a high-level block diagram of a hierarchy-enabling component adapted for supporting the testing scan path and the control scan path of the system-on-chip of FIG. 8.

FIG. 9 depicts a high-level block diagram of a hierarchy-enabling component adapted for supporting the testing scan path and the control scan path of the system-on-chip of FIG. 8. As depicted in FIG. 9, the hierarchy-enabling component 910 is adapted to form part of a testing scan path and form part of a control scan path such that the either the testing scan path portion of the control scan path portion can control the testing scan path portion in a manner for dynamically modifying the testing scan path of a system-on-chip (e.g., dynamically modifying the hierarchy of the system-on-chip).

As depicted and described with respect to FIG. 8, the hierarchy-enabling component 910 forms part of a testing scan path (illustratively, testing scan path 821) and forms part of a control scan path (illustratively, control scan path 823). For example, hierarchy-enabling component 910 may be any one of the hierarchy-enabling components 825 of FIG. 8 (e.g., the hierarchy-enabling component HC00, the hierarchy-enabling component HC 01, and the like). The hierarchy-enabling component 910 may be implemented in any manner for supporting separate testing and control scan paths.

As depicted in FIG. 9, in one embodiment, the hierarchy-enabling component 910 may be implemented using a modified version of an SIB cell as defined in the proposed IEEE P1687 standard (although it should be noted that this example implementation is provided for purposes of clarity and the hierarchy-enabling component 910 may be implemented using any hierarchy-enabling component(s)). In one such embodiment, a standard SIB cell is modified to include: (1) additional input/output interfaces (i.e., HTDI/HTDO input/output interfaces) for the control scan path and (2) logic for supporting separate testing and control scan paths.

As depicted in FIG. 9, hierarchy-enabling component 910 is a modified version of an SIB cell (e.g., such as the SIB cell 420 depicted and described herein with respect to FIG. 4). In the modified SIB cell 910 of FIG. 9, the SIB cell 420 of FIG. 4 has been modified to include two additional input signals (denoted as HDTI and Select), one additional output signal (denoted as HTDO), and one additional signal selection logic component (illustratively, an input control MUX 915). The SIB cell 910 includes an SIB input MUX 911, an SIB register 912, an UpSIB input MUX 913, an UpSIB register 914 and an output MUX 916, which operate in a manner similar to SIB input MUX 421, SIB register 422, UpSIB input MUX 423, UpSIB register 424, and output MUX 426 of SIB cell 420, respectively (except for some difference described below).

In the SIB cell 420 of FIG. 4, the TDI input is coupled to one of the input ports of SIB input MUX 421. In the modified SIB cell 910 of FIG. 9, the TDI input (associated with the testing scan path) is coupled to one of the inputs of an input control MUX 915 and a new HTDI input (associated with the control scan path) is coupled to another one of the inputs of the input control MUX 915. The selection between the TDI input and the HDTI output by input control MUX 915 is controlled using a new SELECT signal which is applied to a control port of the input control MUX 915. In one embodiment, the SELECT signal applied to modified SIB cell 910 is the same signal that is applied to the control ports of input control DEMUX 513 and output control MUX 514 of the control logic 812 of FIG. 8.

In the SIB cell 420 of FIG. 4, the TDI input is coupled to one of the input ports of SIB input MUX 421 which controls which signal is passed through the SIB cell. In the modified SIB cell 910 of FIG. 9, the output of the input control MUX 915 is applied (in place of the TDI input) to the input port of the SIB input MUX 911. Thus, rather than applying the TDI input to the SIB register 912, the TDI input and the HTDI input can each be alternately applied to the SIB register 912, as desired/needed, by controlling the input control MUX 915 and the SIB input MUX 911 which ultimately controls which signal is passed into the SIB register 912.

In the SIB cell 420 of FIG. 4, the output of SIB register 422 is coupled to an input to SIB input MUX 421, an input to UpSIB input MUX 423, the WSIo input (to the second hierarchical layer), and one of the inputs to the output MUX 426 which controls selection between the output of SIB register 422 and the WSOi output (from the second hierarchical layer). In modified SIB cell 910 of FIG. 9, the output of the SIB register 912 is coupled to an input to SIB input MUX 911, an input to UpSIB input MUX 913, the WSIo input (to the second hierarchical layer), one of the inputs to the output MUX 916 which controls selection between the output of SIB register 912 and the WSOi output (from the second hierarchical layer), and, additionally, to the HTDO output.

As depicted in FIG. 9, modified SIB cell 910 is adapted to support both the testing scan path (using the TDI/TDO input/output interfaces, and including the ability to dynamically modify the testing scan by adding/removing WSIo and WSOi to/from the active testing scan path using the UpSIB register as a controller) and the control scan path (using the HTDI/HTDO input/output interfaces). The TDI input and TDO output are coupled to the previous component and the subsequent component in the testing scan path, respectively. The HDTI input and HTDO are coupled to the previous component and the subsequent component in the control scan path, respectively.

For example, referring back to FIG. 8, assume that hierarchy-enabling component 910 is hierarchy-enabling component HC00. In this example, the TDI testing input is coupled to non-hierarchy-enabling testing component 1 and the TDO testing output is coupled to non-hierarchy-enabling testing component 2. In this example, the HTDI control input is coupled to the HTDI port of testing controller 910 and the HTDO control output is coupled to the HTDI input of hierarchy-enabling component HC00 (i.e., the control ports of each hierarchy-enabling component are directly connected to control ports of adjacent hierarchy-enabling components in the control scan path such that the control bits may pass directly between hierarchy-enabling components and do not need to pass through the non-hierarchy-enabling testing components which may be disposed between hierarchy-enabling components).

Figure 10:
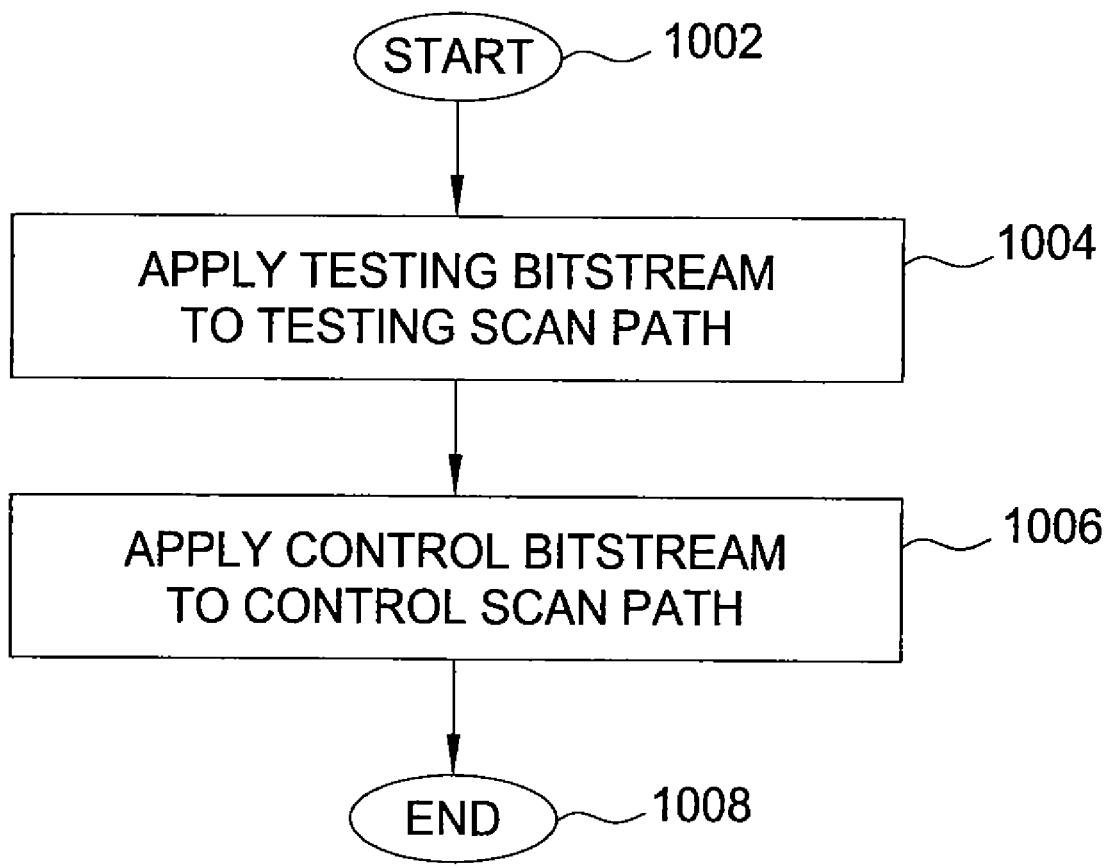
FIG. 10 depicts one embodiment of a method for testing a system-on-chip using separate testing and control scan paths.

FIG. 10 depicts a method according to one embodiment. Specifically, method 1000 of FIG. 10 includes a method for testing a system-on-chip using separate testing and control scan paths where the testing and control scan paths are implemented using separate physical components (e.g., as depicted and described with respect to FIG. 6 and FIG. 7). The testing is performed by a testing system and facilitated by a testing controller. Although depicted and described as being performed serially, at least a portion of the steps of method 1000 of FIG. 10 may be performed contemporaneously, or in a different order than depicted and described with respect to FIG. 10. The method 1000 begins at step 1002 and proceeds to step 1004.

At step 1004, an input testing bitstream is applied to a testing scan path of the system-on-chip. At step 1006, an input control bitstream is applied to a control scan path of the system-on-chip. The input testing bitstream is adapted for use in performing one or more tests on the system-on-chip. The input control bitstream is adapted for dynamically modifying the hierarchy of the testing scan path (thereby modifying the path taken by at least a portion of the input testing bitstream). The input bitstreams are applied to the system-on-chip by the testing controller.

At step 1008, method 1000 ends. Although depicted and described as ending, as described herein, a first output bitstream (associated with the input bitstream) will be captured from the system-on-chip and a second output bitstream (associated with the control bitstream) will be captured from the system-on-chip. The output bitstreams are captured from the system-on-chip by the testing controller. The output bitstreams may be then processed by the testing controller to determine testing results.

Figure 11:
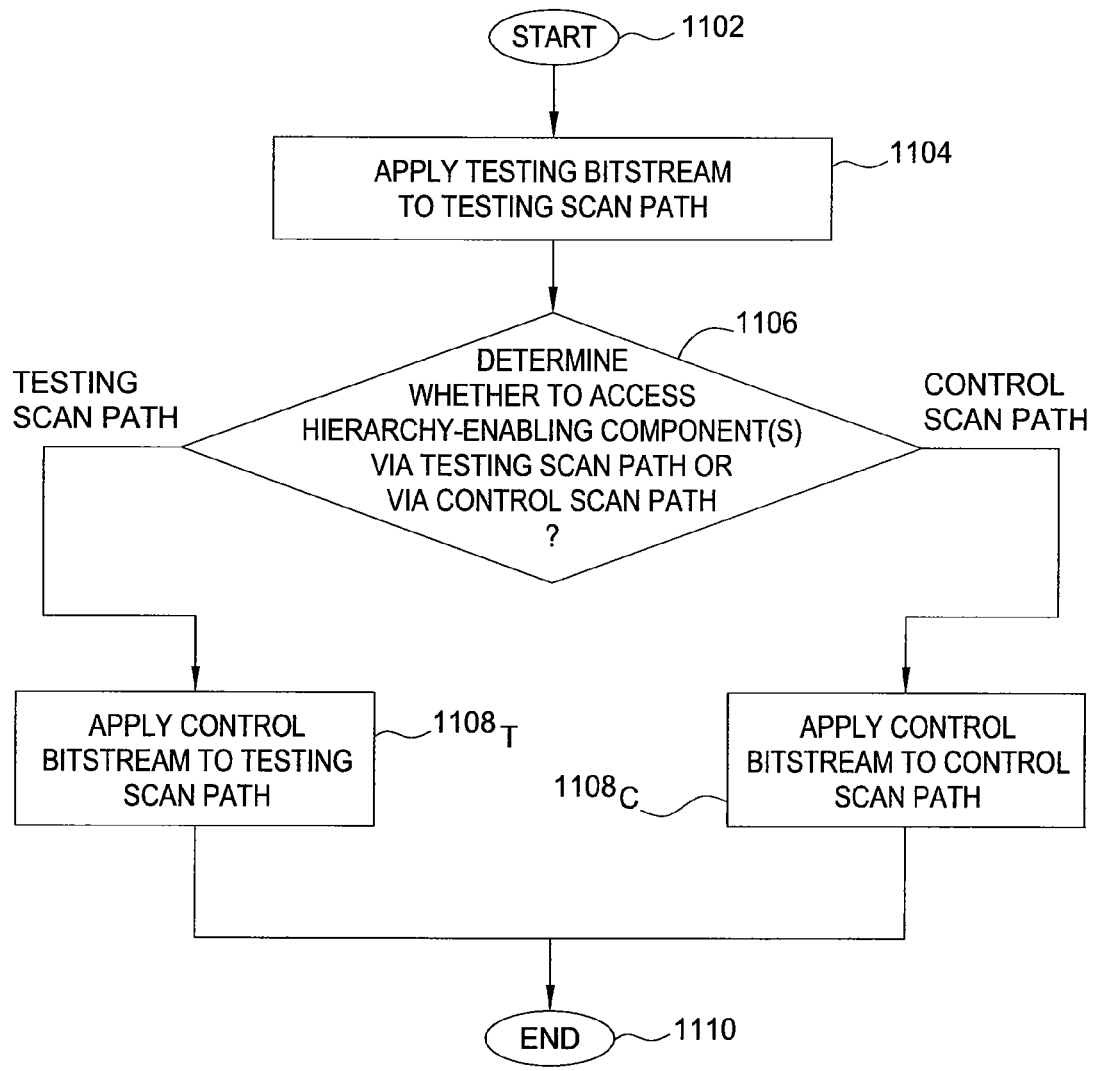
FIG. 11 depicts an exemplary method for testing a system-on-chip using separate testing and control scan paths.

FIG. 11 depicts a method according to one embodiment. Specifically, the exemplary method 1100 of FIG. 11 includes a method for testing a system-on-chip using separate testing and control scan paths where the testing and control scan paths are implemented using combined physical components (e.g., as depicted and described with respect to FIG. 8 and FIG. 9). The testing is performed by a testing system and facilitated by a testing controller. Although depicted and described as being performed serially, at least a portion of the steps of method 1100 of FIG. 11 may be performed contemporaneously, or in a different order than depicted and described with respect to FIG. 11. The method 1100 begins at step 1102 and proceeds to step 1104.

At step 1104, an input testing bitstream is applied to a testing scan path of the system-on-chip.

At step 1106, a determination is made as to whether to access the hierarchy-enabling component(s) via the testing scan path or the control scan path. This determination may be made based on one or more factors (e.g., based on one or more tests currently being performed, the time required to access the hierarchy-enabling component(s), and the like, as well as various combinations thereof).

If a determination is made that the hierarchy-enabling component(s) should be accessed via the testing scan path, method 1100 proceeds to step 1108$_T$, at which point an input control bitstream is applied to the testing scan path. If a determination is made that the hierarchy-enabling component(s) should be accessed via the control scan path, method 1100 proceeds to step 1108$_C$, at which point an input control bitstream is applied to the control scan path.

The input testing bitstream is adapted for use in performing one or more tests on the system-on-chip. The input control bitstream is adapted for accessing one or more hierarchy-enabling components for dynamically modifying the hierarchy of the testing scan path (thereby modifying the path taken by at least a portion of the input testing bitstream). The input bitstreams are applied to the system-on-chip by the testing controller via the testing controller of the system-on-chip.

At step 1110, method 1100 ends. Although depicted and described as ending, as described herein, a first output bitstream (associated with the input bitstream) will be captured from the system-on-chip and a second output bitstream (associated with the control bitstream) will be captured from the system-on-chip. The output bitstreams are captured from the system-on-chip by the testing controller. The output bitstreams may be then processed by the testing controller to determine testing results.

Although primarily depicted and described herein with respect to use of a specific hierarchy-enabling component to implement separate testing and control scan paths on a system-on-chip (namely, the SIB cell as defined by the proposed IEEE P1687 standard), any hierarchy-enabling component may be used to implement separate testing and control scan paths on a system-on-chip.

In one embodiment, for example, a hierarchy-enabling component that is used to support separate testing and control scan paths may be any component supporting a switching architecture which may be used to support at least two hierarchical levels. For example, a hierarchy-enabling component supporting a switching architecture may be a component having at least two inputs and at least two outputs adapted for being connected to form different control paths.

In another embodiment, for example, a hierarchy-enabling component that is used to support separate testing and control scan paths may be a component supporting a bus architecture which may be used to support at least two hierarchical level. For example, a hierarchy-enabling component supporting a bus architecture may include a gateway component connected to at least one slave component (e.g., providing transactional hierarchy by way of transactions between the gateway component and the at least one slave component).

The hierarchy-enabling component(s) used to implement separate testing and control scan paths may be implemented in various other ways.

Although primarily depicted and described herein with respect to testing environments in which one system-on-chip supporting separate testing and control scan paths is tested by a testing system and control of the separate scan paths is provided from a top level of the hierarchy, in other embodiments multiple system-on-chip components (each supporting separate testing and control scan paths) may be tested by a testing system. In such embodiments, control of the separate scan paths of respective system-on-chips may be provided from the top hierarchy level and/or from other levels of the hierarchy (e.g., where one or more system-on-chips are embedded within the scan chain). Some exemplary embodiments are depicted and described with respect to FIG. 12-FIG. 15.

Figure 12:
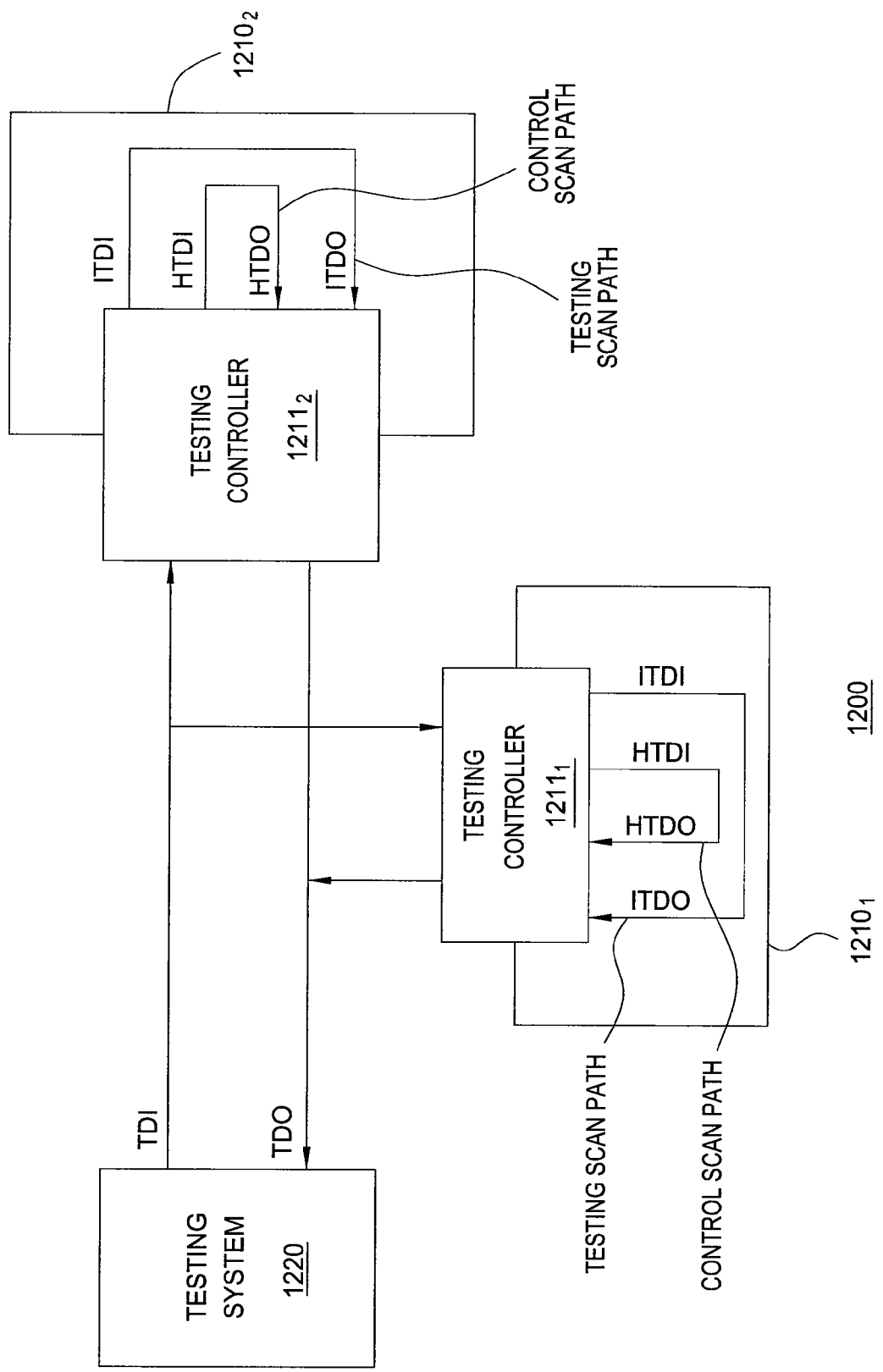
FIG. 12 depicts a high-level block diagram of a testing environment in which a testing system is used for testing two system-on-chips.

FIG. 12 depicts a high-level block diagram of a testing environment in which a testing system is used for testing two system-on-chips. Specifically, in the testing environment 1200, a testing system 1220 is used for testing two system-on-chips 1210$_1$ and 1210$_2$ (collectively, system-on-chips 1210). As depicted in FIG. 12, system-on-chips 1210$_1$ and 1210$_2$ include testing controllers 1211$_1$ and 1211$_2$, respectively, and each system-on-chip 1210 supports a separate testing scan path and control scan path. For example, each of the system-on-chips 1210 operates in a manner similar to the system-on-chip 500 of FIG. 5. In testing system 1200, each testing controller 1211$_1$ and 1211$_2$ is adapted to control the TDI/TDO signals from testing system 1220 to support separate testing and control scan paths (ITDI/ITDO and HTDI/HTDO) for respective system-on-chips 1210$_1$ and 1210$_2$.

Figure 13:
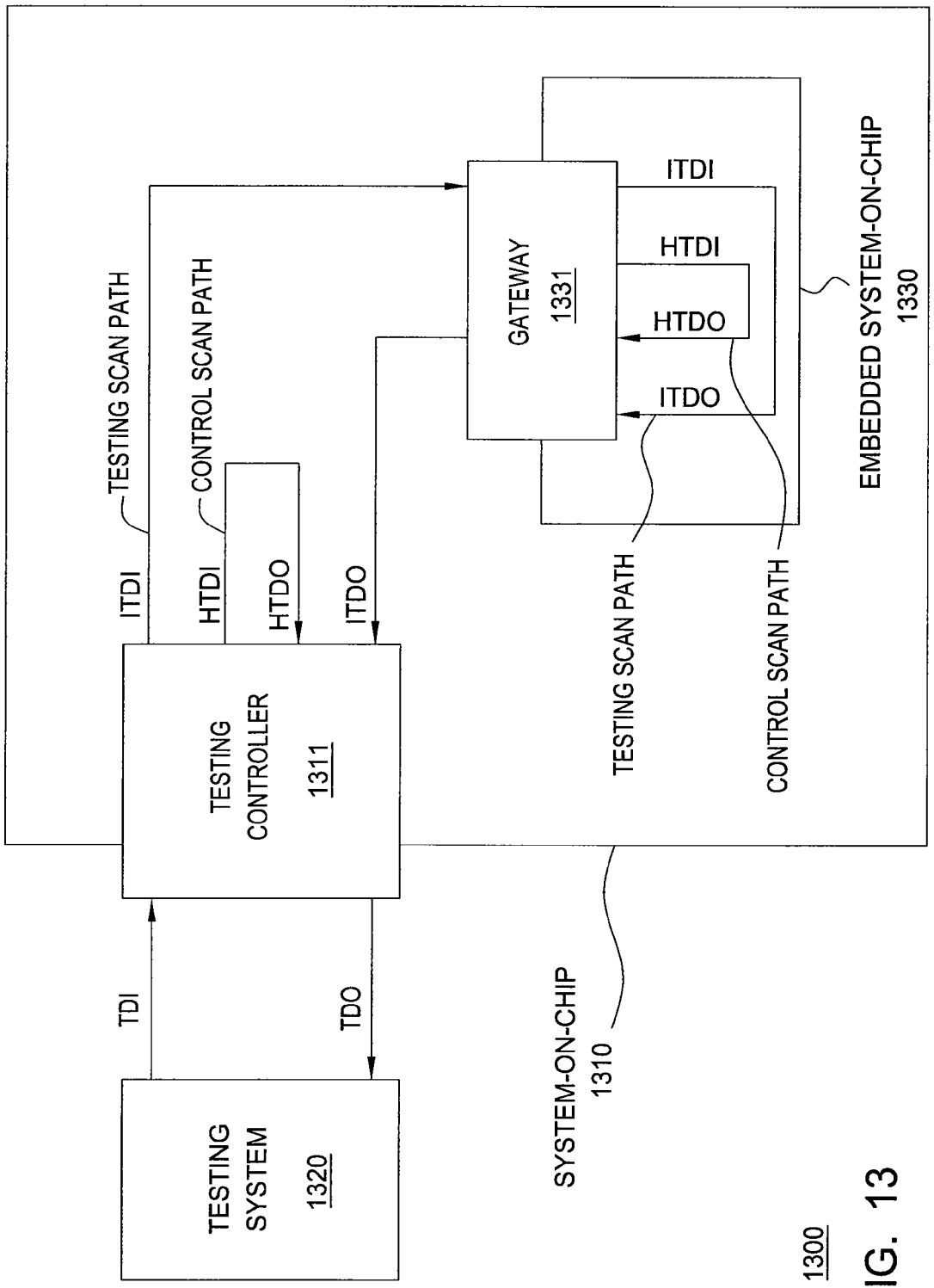
FIG. 13 depicts a high-level block diagram of a testing environment in which a testing system is used for testing a system-on-chip having embedded thereon a system-on-chip.

FIG. 13 depicts a high-level block diagram of a testing environment in which a testing system is used for testing a system-on-chip having embedded thereon a system-on-chip. Specifically, in testing environment 1300, a testing system 1320 is used for testing a system-on-chip 1310 having embedded thereon an embedded system-on-chip 1330. The system-on-chip 1310 includes a testing controller 1311. The system-on-chip 1310 supports separate testing and control scan paths.

As depicted in FIG. 13, embedded system-on-chip 1330 includes a gateway 1331 and is accessed via the testing scan path (via ITDI/ITDO) from testing controller 1311 of system-on-chip 1310. The ITDI of system-on-chip 1310 is the TDI input to embedded system-on-chip 1330 and the ITDO of system-on-chip 1310 is the TDO output from embedded system-on-chip 1310. The ITDI/ITDO testing scan path signals from/to testing controller 1311 of system-on-chip 1310 are the input/output signals to/from gateway 1331 of embedded system-on-chip 1330. The embedded system-on-chip 1330 supports separate testing and control scan paths. Thus, system-on-chip 1310 and embedded system-on-chip 1330 each operate in a manner similar to system-on-chip 500 of FIG. 5.

Figure 14:
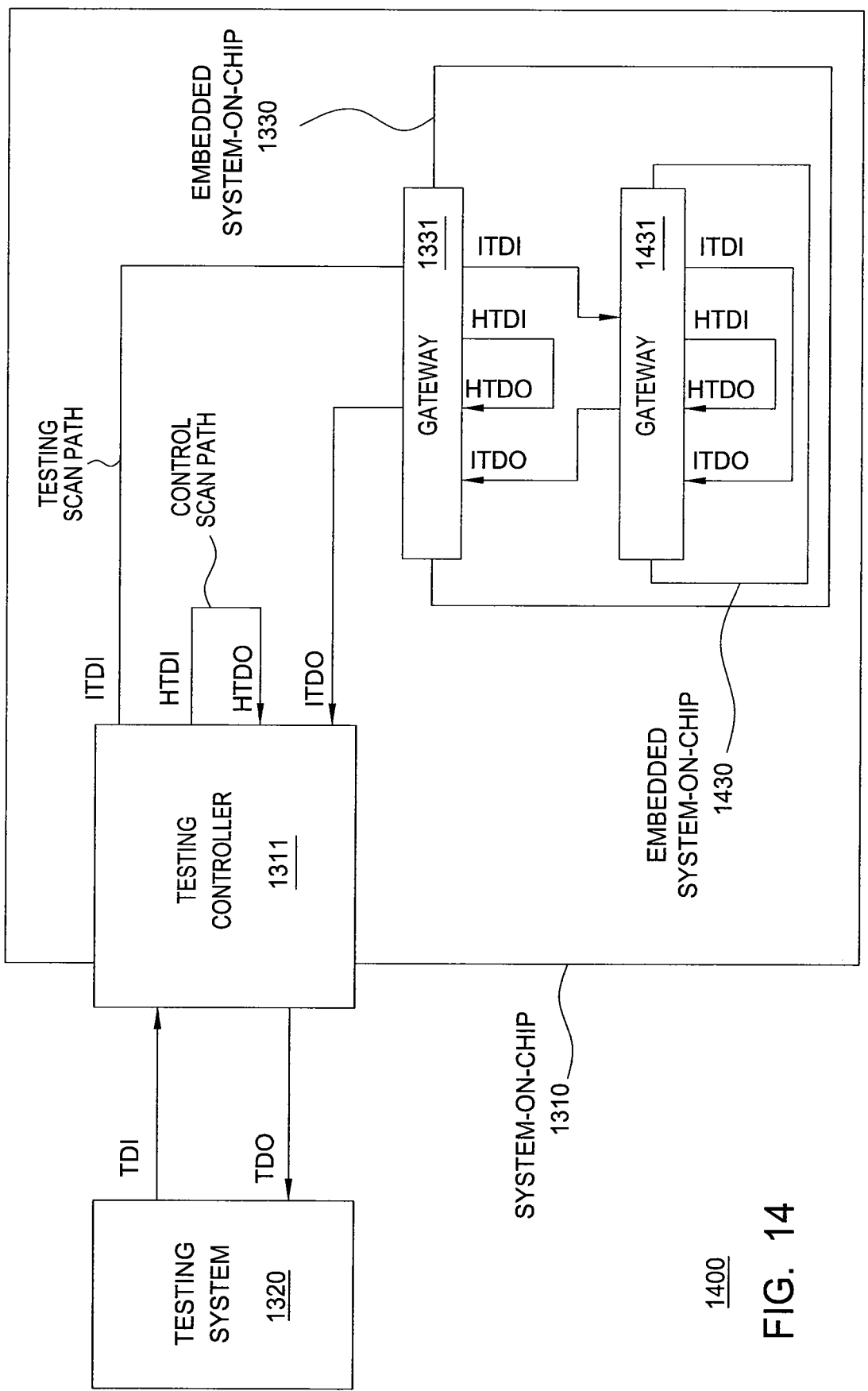
FIG. 14 depicts a high-level block diagram of a testing environment in which a testing system is used for testing a system-on-chip having embedded thereon a system-on-chip which also includes an embedded system-on-chip.

FIG. 14 depicts a high-level block diagram of a testing environment in which a testing system is used for testing a system-on-chip having embedded thereon a system-on-chip which also includes an embedded system-on-chip. As depicted in FIG. 14, the testing environment 1400 of FIG. 14 is similar to the testing environment 1300 of FIG. 13 in which embedded system-on-chip 1330 further includes an embedded system-on-chip 1430. The embedded system-on-chip 1430 includes a gateway 1431. The testing scan path of embedded system-on-chip 1330 is used as the TDI input to gateway 1431 and as the TDO output from gateway 1431. In other words, the ITDI of the embedded system-on-chip 1330 is the TDI input to embedded system-on-chip 1430 and the ITDO output of embedded system-on-chip 1330 is the TDO output from embedded system-on-chip 1430. The embedded system-on-chip 1430 also supports separate testing and control scan paths. Thus, system-on-chip 1310 and embedded system-on-chips 1330 and 1430 each operate in a manner similar to system-on-chip 500 of FIG. 5.

Figure 15:
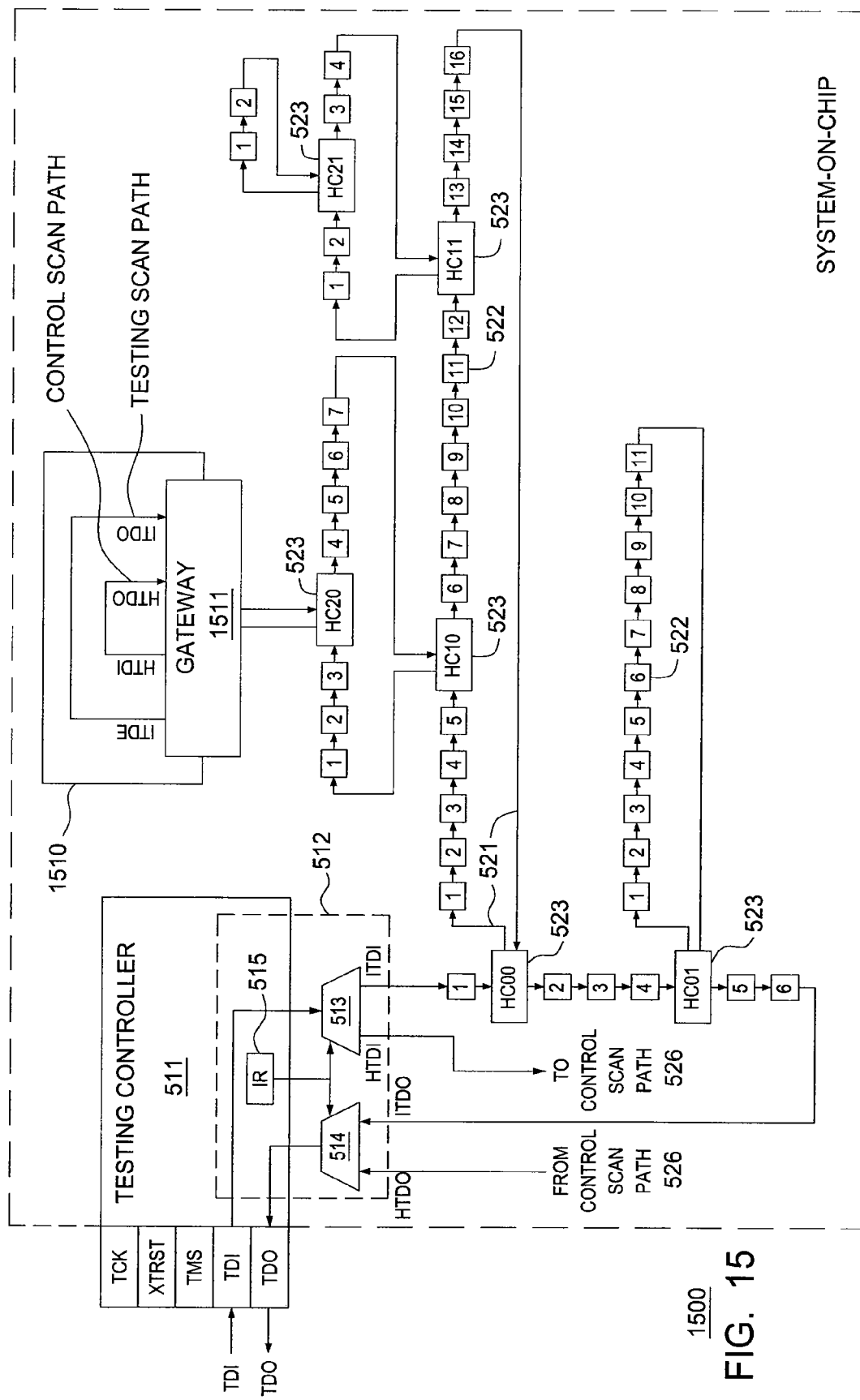
FIG. 15 depicts a high-level block diagram of the system-on-chip of FIG. 5 in which a system-on-chip is embedded in one of the hierarchical levels.

FIG. 15 depicts a high-level block diagram of the system-on-chip of FIG. 5 in which a system-on-chip is embedded in one of the hierarchical levels. Specifically, system-on-chip 1500 of FIG. 15 is the system-on-chip 500 of FIG. 5 in which the chain of boundary scan cells previously accessible via hierarchy-enabling component HC20 is replaced with an embedded system-on-chip 1510 which provides access to embedded system-on-chip 1510. The embedded system-on-chip 1510 includes a gateway 1511. As depicted in FIG. 15, access to embedded system-on-chip 1510 is not provided from testing controller 511 (i.e., the top level of the hierarchy); rather, access to embedded system-on-chip 1510 is provided from a lower level of the hierarchy (illustratively, via HC20 and gateway 1511). The testing scan path (ITDI/ITDO) of system-on-chip 1500 provides the input/output for embedded system-on-chip 1510. In other words, the ITDI of the testing scan path of system-on-chip 1500 is the TDI input to gateway 1511 (e.g., via WSIo of HC20) and the ITDO output of the testing scan path of system-on-chip 1500 is the TDO output from gateway 1511 (e.g., via WSOi of HC20).

As depicted in FIG. 13, FIG. 14, and FIG. 15, gateways of embedded system-on-chips (illustratively, gateways 1331, 1431, and 1511 of embedded system-on-chips 1330, 1430, and 1510) may be implemented in a number of ways. In one embodiment, a gateway may be implemented as control logic that is adapted for splitting an input bitstream across testing and control scan path inputs as desired/needed and selecting an output bitstream from testing and control scan path outputs as desired/needed. In one such embodiment, for example, a gateway may be implemented in a manner similar to control logic 512 of FIG. 5. In one embodiment, a gateway may be implemented as a testing controller (e.g., such as the testing controller 511 depicted and described with respect to FIG. 5).

In one embodiment, a gateway may be implemented as a hierarchy-enabling component (e.g., as an SIB, as a crossroad device, and the like). A gateway may be implemented in various other ways.

As depicted in the exemplary embodiments of FIGS. 12-15, modularity may be supported using any number of levels of hierarchy. This enables any number of system-on-chip devices to be implemented at any number of levels of a hierarchy and, further, to be controlled from any level of the hierarchy. This enables a testing scan path (e.g., split from a scan path at one level of a hierarchy) to be further split to form separate testing and control scan paths at another level of the hierarchy. Thus, any level of modularity, supporting any number of hierarchical levels and any number of levels of testing and control scan paths, may be supported.

Figure 16:
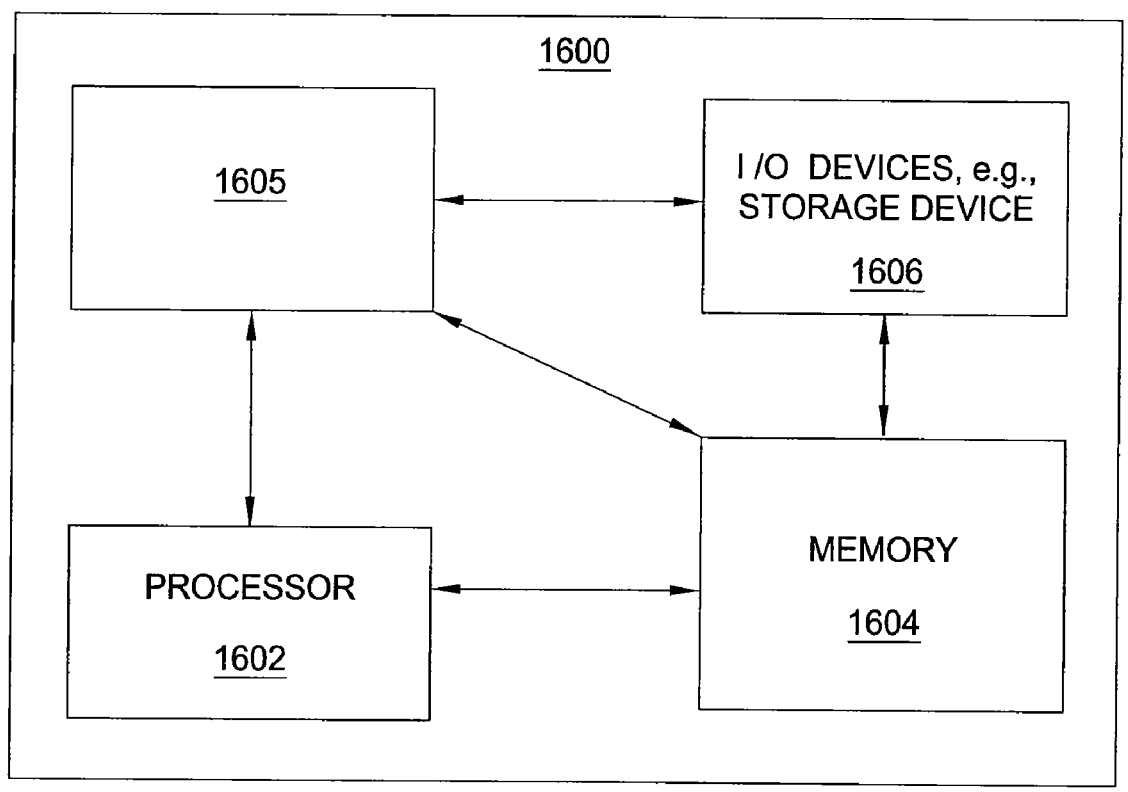
FIG. 16 depicts a high-level block diagram of a general-purpose computer suitable for use in performing the functions described herein.

FIG. 16 depicts a high-level block diagram of a general-purpose computer suitable for use in performing the functions described herein. As depicted in FIG. 16, system 1600 comprises a processor element 1602 (e.g., a CPU), a memory 1604, e.g., random access memory (RAM) and/or read only memory (ROM), a testing module 1605, and various input/output devices 1606 (e.g., storage devices, including but not limited to, a tape drive, a floppy drive, a hard disk drive or a compact disk drive, a receiver, a transmitter, a speaker, a display, an output port, and a user input device (such as a keyboard, a keypad, a mouse, and the like)).

It should be noted that the present invention may be implemented in software and/or in a combination of software and hardware, e.g., using application specific integrated circuits (ASIC), a general purpose computer or any other hardware equivalents. In one embodiment, the present testing process 1605 can be loaded into memory 1604 and executed by processor 1602 to implement the functions as discussed above. As such, testing process 1605 (including associated data structures) of the present invention can be stored on a computer readable medium or carrier, e.g., RAM memory, magnetic or optical drive or diskette, and the like.

Although various embodiments which incorporate the teachings of the present invention have been shown and described in detail herein, those skilled in the art can readily devise many other varied embodiments that still incorporate these teachings.

What is claimed is:

1. A system-on-chip apparatus, comprising:
   a testing scan path comprising a plurality of testing components including at least one hierarchy-enabling testing component communicatively coupled to the at least one hierarchy-enabling testing component of the testing scan path; and
   a control scan path comprising at least one control component, the at least one control component is adapted to control the at least one hierarchy-enabling testing component in a manner for dynamically modifying the testing scan path;
   wherein the testing scan path and the control scan path are independent.

2. The apparatus of claim 1, wherein the testing scan path includes a hierarchy having a first hierarchical level and a second hierarchical level, wherein dynamically modifying the testing scan path comprises dynamically modifying the hierarchy of the testing scan path.

3. The apparatus of claim 2, wherein dynamically modifying the hierarchy of the testing scan path comprises one of selecting the second hierarchical level to activate the second hierarchical level and deselecting the second hierarchical level to deactivate the second hierarchical level.

4. The apparatus of claim 1, wherein the testing scan path is adapted for propagating a testing bitstream, wherein the control scan path is adapted for propagating a control bitstream.

5. The apparatus of claim 4, wherein the control bitstream is adapted for use by the at least one control component to control the at least one hierarchy-enabling testing component in a manner for modifying the testing scan path.

6. The apparatus of claim 1, wherein the control component is adapted to provide a control signal for controlling a logic element of the hierarchy-enabling testing component.

7. A system-on-chip apparatus, comprising:
   a testing scan path comprising a plurality of non-hierarchy-enabling testing components and at least one hierarchy-enabling component communicatively coupled to the at least one hierarchy-enabling testing component of the testing scan path; and
   a control scan path comprising the at least one hierarchy-enabling component;
   wherein the at least one hierarchy-enabling component is adapted for dynamically modifying the testing scan path using the control scan path.

8. The apparatus of claim 7, wherein the testing scan path includes a hierarchy having a first hierarchical level and a second hierarchical level, wherein dynamically modifying the testing scan path comprises dynamically modifying the hierarchy of the testing scan path.

9. The apparatus of claim 7, wherein the testing scan path is adapted for propagating a testing bitstream and the control scan path is adapted for propagating a control bitstream.

10. The apparatus of claim 9, wherein the control bitstream controls at least a portion of hierarchy-enabling component in a manner for dynamically modifying the testing scan path.

11. The apparatus of claim 7, wherein each of the at least one hierarchy-enabling component comprises a select element adapted for selecting between a testing bitstream and a control bitstream.

12. The apparatus of claim 7, wherein the testing scan path and control scan path are independent.

13. A system-on-chip apparatus, comprising:
    a testing scan path communicatively coupled to a control scan path, the testing scan path is adapted for propagating a testing bitstream; and
    the control scan path is adapted for propagating a control bitstream;
    wherein the control bitstream is adapted for modifying propagation of the testing bitstream within the testing scan path.

14. The apparatus of claim 13, wherein the testing scan path comprises a plurality of non-hierarchy-enabling testing components and at least one hierarchy-enabling testing component.

15. The apparatus of claim 14, wherein the control scan path comprises at least one control component.

16. The apparatus of claim 15, wherein the at least one control component is coupled to the at least one hierarchy-enabling testing component in a manner for modifying propagation of the testing bitstream within the testing scan path.

17. The apparatus of claim 13, wherein the testing scan path is formed using a plurality of non-hierarchy-enabling testing components and at least one hierarchy-enabling component.

18. The apparatus of claim 13, wherein the control scan path is formed using the at least one hierarchy-enabling component.

19. The apparatus of claim 18, wherein the at least one hierarchy-enabling component is adapted for using the control bitstream of the control scan path to modify propagation of the testing bitstream within the testing scan path.

20. The apparatus of claim 13, wherein the testing scan path comprises a first hierarchical level and a second hierarchical level, wherein the second hierarchical level is adapted for being dynamically selected to be activated and dynamically deselected to be deactivated.

* * * * *